United States Patent
Yamaguchi et al.

(10) Patent No.: US 9,819,222 B2
(45) Date of Patent: Nov. 14, 2017

(54) POWER CONTROL APPARATUS AND CONTROL METHOD

(71) Applicant: Panasonic Intellectual Property Management Co., Ltd., Osaka (JP)

(72) Inventors: Takao Yamaguchi, Osaka (JP); Yoshikazu Mihara, Hyogo (JP); Hiroshi Hanafusa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 218 days.

(21) Appl. No.: 14/918,527

(22) Filed: Oct. 20, 2015

(65) Prior Publication Data
US 2016/0043594 A1    Feb. 11, 2016

Related U.S. Application Data

(63) Continuation of application No. PCT/JP2014/002927, filed on Jun. 3, 2014.

(30) Foreign Application Priority Data

Jun. 19, 2013    (JP) .................................. 2013-128262

(51) Int. Cl.
*H02J 9/06* (2006.01)
*G01R 19/165* (2006.01)
(Continued)

(52) U.S. Cl.
CPC .......... *H02J 9/06* (2013.01); *G01R 19/16538* (2013.01); *G01R 19/16547* (2013.01);
(Continued)

(58) Field of Classification Search
CPC ...... H02J 9/06; H02J 3/14; H02J 9/062; H02J 7/0068; H02J 9/04; H02J 9/061;
(Continued)

(56) References Cited

U.S. PATENT DOCUMENTS

| | | | | | |
|---|---|---|---|---|---|
| 5,825,597 | A | * | 10/1998 | Young .................... | H02P 6/085 318/806 |
| 7,764,478 | B2 | * | 7/2010 | Chishima ................ | H02J 9/005 361/18 |
| 8,669,729 | B2 | * | 3/2014 | Kono ..................... | B60L 3/003 318/400.26 |

FOREIGN PATENT DOCUMENTS

| | | |
|---|---|---|
| JP | 2005-102446 | 4/2005 |
| JP | 2007-295650 | 11/2007 |

(Continued)

OTHER PUBLICATIONS

International Search Report of PCT application No. PCT/JP2014/002927 dated Jul. 1, 2014.

*Primary Examiner* — Jung Kim
(74) *Attorney, Agent, or Firm* — Greenblum & Bernstein, P.L.C.

(57) ABSTRACT

A power control apparatus includes the following elements. A measure measures a value of a current to be supplied from a power supply source to a load set. A switch is disposed on a power supply path from power supply source to a load set. A setter sets a first maximum current value in the case of a normal state in which the load set receives power from a main power supply source and sets a second maximum current value when the load set receives power from the sub power supply source. Control circuitry turns OFF the switch when the value of the measured current exceeds the first maximum current value in the case of the normal state and turns OFF the switch when the load set receives power from the sub power supply source and the value of the measured current exceeds the second maximum current value.

11 Claims, 21 Drawing Sheets

(51) Int. Cl.
*H02J 3/14* (2006.01)
*H02J 7/00* (2006.01)

(52) U.S. Cl.
CPC ............... *H02J 3/14* (2013.01); *H02J 7/0068* (2013.01); *H02J 9/062* (2013.01); *Y02B 70/3225* (2013.01); *Y04S 20/222* (2013.01)

(58) Field of Classification Search
CPC ........ G01R 19/16538; G01R 19/16547; Y04S 20/222; Y02B 70/3225
See application file for complete search history.

(56) References Cited

FOREIGN PATENT DOCUMENTS

| | | |
|---|---|---|
| JP | 2008-178275 | 7/2008 |
| JP | 2011-205871 | 10/2011 |
| JP | 2011-234561 | 11/2011 |

* cited by examiner

| STATE | MAXIMUM CURRENT VALUE (A) | RESTART TIME (SECONDS) |
|---|---|---|
| NORMAL STATE | 40 A | 0 |
| SHORTAGE STATE | 30 A | 10 |
| POWER INTERRUPTION STATE | 10 A | 30 |

SETTING INFORMATION STORAGE UNIT

FIG. 9

| DATE | ELECTRICITY CONSUMPTION (kWh) | | |
|---|---|---|---|
| | COMMERCIAL POWER SUPPLY SOURCE | STORAGE BATTERY SYSTEM | PHOTOVOLTAIC POWER GENERATION SYSTEM |
| 12:00-13:00, JANUARY 1, 2013 | 25.0 | — | — |
| 13:00-14:00, JANUARY 1, 2013 | 20.0 | — | — |
| 14:00-15:00, JANUARY 1, 2013 | 18.0 | 1.0 | — |
| 15:00-16:00, JANUARY 1, 2013 | — | 4.0 | — |

MEASUREMENT RESULT STORAGE UNIT

FIG. 10

| HOUSEHOLD METER ID | CUSTOMER ID | DATE | COMMERCIAL POWER SUPPLY SOURCE | | STORAGE BATTERY SYSTEM | | TOTAL CHARGE |
|---|---|---|---|---|---|---|---|
| | | | ELECTRICITY CONSUMPTION | CHARGE | ELECTRICITY CONSUMPTION | CHARGE | |
| 1 | 1 | 12:00-13:00, JANUARY 1, 2013 | 25.0 kWh | (25.0 × α) YEN | — | — | (25.0 × α) YEN |
| | | 13:00-14:00, JANUARY 1, 2013 | 20.0 kWh | (20.0 × α) YEN | — | — | (20.0 × α) YEN |
| | | 14:00-15:00, JANUARY 1, 2013 | 18.0 kWh | (18.0 × α) YEN | 1.0 kWh | (1.0 × β) YEN | (18.0 × α) + (1.0 × β) YEN |
| | | 15:00-16:00, JANUARY 1, 2013 | — | — | 4.0 kWh | (4.0 × β) YEN | (4.0 × β) YEN |
| | | 16:00-17:00, JANUARY 1, 2013 | 10.0 kWh | (10.0 × α) YEN | 2.0 kWh | (2.0 × β) YEN | (10.0 × α) + (2.0 × β) YEN |
| 2 | 2 | | | | | | |

CHARGE STORAGE UNIT

POWER CONTROL APPARATUS AND CONTROL METHOD

BACKGROUND

1. Technical Field

The present disclosure relates to a power control apparatus that controls maximum electric power to be supplied from a power supply source to a load set.

2. Description of the Related Art

Generally, an ampere breaker is provided in an electrical circuit shunted for each customer, and if a current which exceeds the contracted amperage of a customer flows through the electrical circuit, the electrical circuit is disconnected by the ampere breaker (see, for example, Japanese Patent No. 5044225).

SUMMARY

These days, for some reasons, such as a decrease in the power generation due to a shortage of resources or a shutdown of a power plant due to the influence of a natural disaster, a power shortage sometimes occurs. Accordingly, power supply which responds to a power shortage is desired.

One non-limiting and exemplary embodiment provides a power control apparatus that controls maximum electric power to be supplied from a power supply source to a load set in response to a power shortage.

In one general aspect, the techniques disclosed here feature a power control apparatus including: a measure that measures a value of a current to be supplied from a power supply source to a load set; a switch disposed on a power supply path from power supply source to a load set; a setter that sets a first maximum current value as a maximum current control value in the case of a normal state in which the load set receives power from a main power supply source and that sets a second maximum current value, which is smaller than the first maximum current value, as the maximum current control value when the load set receives power from the sub power supply source due to an occurrence of power interruption of the main power supply source; and control circuitry that turns OFF the switch when the value of the current measured by the measure exceeds the first maximum current value in the case of the normal state and that turns OFF the switch when the load set receives power from the sub power supply source due to an occurrence of power interruption of the main power supply source and the value of the current measured by the measure exceeds the second maximum current value.

It should be noted that these general or specific aspects may be implemented as a system, a method, and a computer program, or any selective combination of a system, an apparatus, a method, and a computer program.

In a power control apparatus according to an aspect of the present disclosure, it is possible to control maximum electric power to be supplied from a power supply source to a load set in accordance with whether the state is the first state or the second state.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 9 illustrates an example of information stored in a measurement result storage unit according to the fourth embodiment;

FIG. 10 illustrates an example of information stored in a charge storage unit according to the fourth embodiment;

DETAILED DESCRIPTION

[Underlying Knowledge Forming Basis of the Present Disclosure]

These days, for some reasons, such as a decrease in the power generation due to a shortage of resources or a shutdown of a power plant due to the influence of a natural disaster, electric power supplied from a commercial power supply source is running short. Particularly, in a time period for which a considerable amount of electricity is consumed, such as in the daytime in summer, the supply of electric power from a commercial power supply source does not keep up with the demand. Thus, power interruptions are likely to occur.

Under the present circumstances, electric power companies take measures to prevent sudden occurrences of power interruptions by conducting scheduled outages in a time period for which power consumption is expected to be increased. However, scheduled outages impose a heavy burden on customers and electric power companies.

To address the above-described problems, the present inventor has found that, when the power supply state of a commercial power supply source is a shortage state, such a shortage state may be alleviated by restricting maximum electric power to be supplied from the commercial power supply source to each customer so that scheduled outages do not have to be conducted.

Meanwhile, distributed power supply sources, such as a storage battery system and a photovoltaic power generation system, are coming into a wide use, and such a distributed power supply source may be utilized as, for example, an emergency power supply source in case of power interruptions of a commercial power supply source. However, in the storage battery system, there are limitations in the storage capacity or the conversion capacity of a power conditioner. It is thus difficult to secure the amount of power comparable to that of a commercial power supply source by using a distributed power supply source.

To address the above-described problems, the present inventor has found that reliable and stable power supply from a distributed power supply source may be implemented by restricting maximum electric power to be supplied from the distributed power supply source to each customer in accordance with the power supply capability of the distributed power supply source.

According to an embodiment of the present disclosure, based on the above-described inventor's knowledge, there is provided a power control apparatus that restricts the maximum electric power to be supplied from a commercial power supply source and that from a distributed power supply source to a load set in accordance with the power supply state of the commercial power supply source and the power supply capability of the distributed power supply source.

[1. First Embodiment]

An example of a power supply system to which a power control apparatus according to a first embodiment is applied will first be described.

Figure 1:
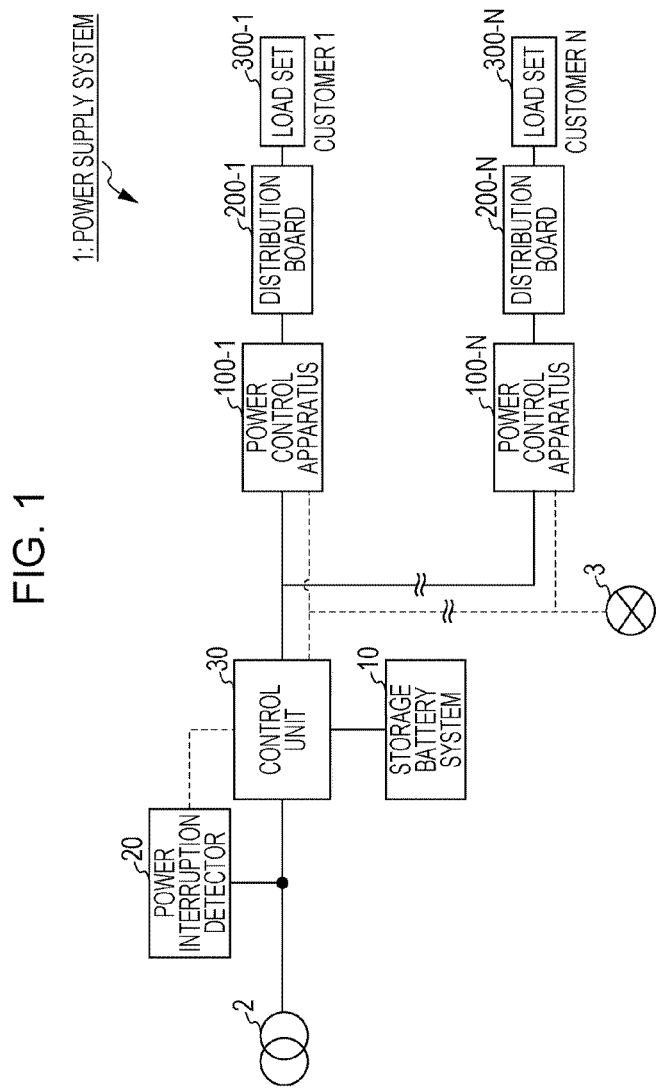
FIG. 1 is a diagram illustrating a power supply system according to a first embodiment.

Normally, except for a case in which power interruptions occur in a commercial power supply source, a power supply system 1 shown in FIG. 1 supplies power from a commercial power supply source to each of load sets 300-1 through 300-N via an electrical grid 2. In the case of power interruptions of the commercial power supply source, the power supply system 1 supplies power from a storage battery system 10 to each of the load sets 300-1 through 300-N. The load sets 300-1 through 300-N are sets of loads used by customers 1 through N, respectively. N is a desired number.

The storage battery system 10 charges power supplied from the commercial power supply source and supplies power to the load sets in the case of power interruptions.

A power interruption detector 20 detects a power interruption state of the commercial power supply source, and then detects a power recovery state of the commercial power supply source after the power interruption state has been detected. Hereinafter, the power interruption state and the power recovery state of the commercial power supply source will be simply referred to as the "power interruption state" and the "power recovery state", respectively.

Upon detecting the power interruption state, the power interruption detector 20 sends information indicating that the power supply state is the power interruption state to a control unit 30. Upon detecting the power recovery state, the power interruption detector 20 sends information indicating that the power supply state is the power recovery state to the control unit 30.

The power interruption detector 20 may utilize a known power interruption detecting method and power recovery detecting method. For example, if a state in which the voltage of a power supply path connected to the power interruption detector 20 is equal to or lower than a predetermined threshold continues for a certain time or longer, the power interruption detector 20 may determine that the power supply state is the power interruption state, thereby detecting the occurrence of the power interruption state. If, after the power interruption state has been detected, a state in which the voltage of the power supply path connected to the power interruption detector 20 is within a predetermined threshold continues for a certain time or longer, the power interruption detector 20 may determine that the power supply state is the power recovery state, thereby detecting the occurrence of the power recovery state.

The control unit 30 switches between power supply sources for load sets, that is, between the commercial power supply source and the storage battery system 10.

More specifically, unless the power supply state is the power interruption state, the control unit 30 distributes power supplied from the commercial power supply source to the load sets. Then, upon receiving information indicating that the power supply state is the power interruption state from the power interruption detector 20, the control unit 30 switches the power supply source for the load sets from the commercial power supply source to the storage battery system 10, and distributes power supplied from the storage battery system 10 to the load sets. Then, upon receiving information indicating that the power supply state is the power recovery state from the power interruption detector 20, the control unit 30 switches the power supply source for the load sets from the storage battery system 10 to the commercial power supply source, and distributes power supplied from the commercial power supply source to the load sets.

When switching the power supply source for the load sets from the commercial power supply source to the storage battery system 10, the control unit 30 sends information indicating that the power supply state is the power interruption state to each of power control apparatuses 100-1 through 100-N. When switching the power supply source for the load sets from the storage battery system 10 to the commercial power supply source, the control unit 30 sends information indicating that the power supply state is the power recovery state to each of the power control apparatuses 100-1 through 100-N.

The power control apparatuses 100-1 through 100-N are each provided in a power supply path shunted for an associated customer, and control power to be distributed from the control unit 30 to the load sets used by the respective customers.

The configuration of each of the power control apparatuses 100-1 through 100-N according to this embodiment will be described below with reference to FIG. 2.

The power control apparatus 100 includes a current value measuring unit 110, an opening-and-closing unit 120, a controller 130, a communication unit 140, a setting information storage unit 150, and a setting unit 160.

The current value measuring unit 110 sequentially measures the values of a current flowing through the power supply path.

The opening-and-closing unit 120 is provided in the power supply path to the load set, and opens and closes the power supply path under the control of the controller 130, which will be discussed later.

The controller 130 performs OFF control and ON control of the opening-and-closing unit 120, on the basis of a maximum current value and a restart time which are set by the setting unit 160, which will be discussed later, as a maximum current control value and a restart control time.

More specifically, if the controller 130 determines that the current value measured by the current value measuring unit 110 is equal to or greater than the maximum current value set by the setting unit 160, it performs OFF control of the opening-and-closing unit 120 so as to stop supplying power to the load set. The controller 130 has a timer function, and if it determines that the restart time set by the setting unit 160 has elapsed after performing OFF control of the opening-and-closing unit 120, it performs ON control of the opening-and-closing unit 120 so as to restart supplying power to the load set.

The communication unit 140 receives, from a control center of the commercial power supply source via a network 3, information indicating that power supplied from the commercial power supply source is running short (hereinafter such a state will be referred to as a "shortage state") or information indicating that the shortage state is overcome, that is, the power supply state of the commercial power supply source is in a normal state (hereinafter such a state will be referred to as a "normal state"). The above-described recovery state also means the normal state.

The communication unit 140 also receives, from the control unit 30, information indicating that the power supply state is the power interruption state or information indicating that the power supply state is the power recovery state.

The setting information storage unit 150 stores therein maximum current values used in the normal state, in the shortage state, and in the power interruption state that are set by the setting unit 160 as the maximum current control values used by the controller 130, and also stores therein restart times used in the normal state, in the shortage state, and in the power interruption state that are set by the setting unit 160 as the restart control times used by the controller 130.

Figure 3:
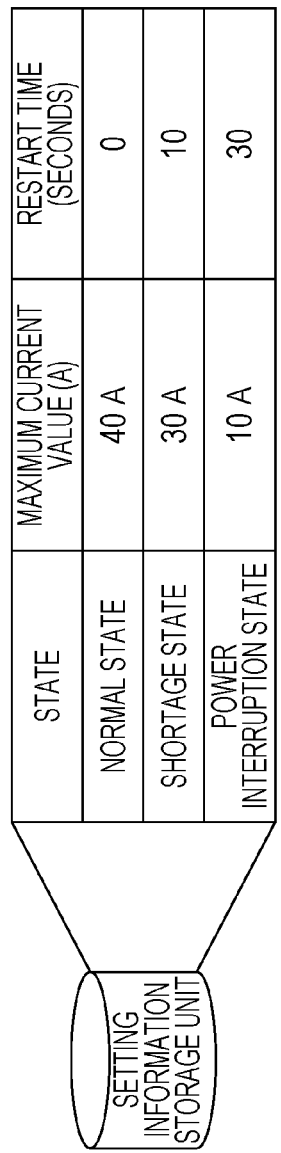
FIG. 3 illustrates an example of information stored in a setting information storage unit according to the first embodiment.

FIG. 3 illustrates an example of information stored in the setting information storage unit 150.

In FIG. 3, the maximum current value and the restart time in the normal state are "40 A" and "0 seconds", respectively, the maximum current value and the restart time in the shortage state are "30 A" and "10 seconds", respectively, and the maximum current value and the restart time in the power interruption state are "10 A" and "30 seconds", respectively.

In FIG. 3, the maximum current value in the shortage state and that in the power interruption state are "30 A" and "10 A", respectively, which are lower than the maximum current value in the normal state, that is, "40 A". The restart times in the shortage state and in the power interruption state are "10 seconds" and "30 seconds", respectively, which are longer than the restart time in the normal state, that is, "0 seconds".

Since the shortage state is a state in which power supplied from the commercial power supply source is running short, it is desirable to reduce the amount of power supplied from the commercial power supply source to a smaller level than in the normal state. In the power interruption state, power is supplied to a load set from a storage battery system having a lower power supply capability than that of the commercial power supply source, and thus, it is desirable to reduce the amount of power to a lower level than in the normal state. Accordingly, as shown in FIG. 3, it is desirable to set the maximum current value in the shortage state and that in the power interruption state to be lower than that in the normal state and to set the restart time in the shortage state and that in the power interruption state to be longer than that in the normal state.

In FIG. 3, the maximum current value in the shortage state is set to be higher than that in the power interruption state, and the restart time in the shortage state is set to be longer than that in the power interruption state. However, the maximum current value in the power interruption state and that in the shortage state may be the same value, and the restart time in the power interruption state and that in the shortage state may be the same time.

A description will now be given of approaches to setting the maximum current values and the restart times in the normal state, in the shortage state, and in the power interruption state.

[Part 1] It is desirable to set the maximum current value and the restart time in the power interruption state on the basis of the power supply capability of the storage battery system.

There is a limitation in the charging capacity of the storage battery system. Moreover, depending on the conversion capacity of a power conditioner disposed in the storage battery system, electric power per unit time that can be supplied to all loads which receive power from the power supply source may become smaller than that of the commercial power supply source.

Accordingly, it is desirable to set the maximum current value in the power interruption state in accordance with the discharging capacity per unit time of the storage battery system and the number of customers that receive power from the power supply source.

It is also desirable to set the maximum current value in the power interruption state in accordance with the charging capacity of the storage battery system and the number of customers that receive power from the power supply source so that power can be supplied to the customers from the storage battery system even if the power interruption state continues for a considerable time period.

If the time period for which the power interruption state will continue is known in advance, such as in scheduled outages, the maximum current value in the power interruption state may be set so that power can be supplied from the storage battery system to customers during this time period.

[Part 2] The maximum current values and the restart times in the normal state, in the shortage state, and in the power interruption state may be set on the basis of electric-power supply and demand contract made between a customer and a power supply center (electric power company or high-voltage electricity bulk purchaser).

More specifically, for example, the maximum current value in the normal state may be the value of the contracted amperage between a customer and a power supply center.

If a certain customer pays a higher basic charge or a higher contracted electricity charge (yen/kWh), the maximum current value and the restart time in the shortage state and those in the power interruption state for this customer may be set preferentially over other customers.

[Part 3] The maximum current values and the restart times in the normal state, the shortage state, and the power interruption state may be set on the basis of history information concerning electric power consumed by a customer.

More specifically, on the basis of the maximum current values measured on the months of a certain year, the maximum current value in the normal state for the following year may be set. The average value per unit time of current values measured on the months of a certain year may be set to be the maximum current value in the shortage state for the following year. In this manner, by setting the average value of the measured current values per unit time to be the maximum current value in the shortage state, it is possible to reduce the burden on customers while the maximum electric power in the shortage state is restricted.

[Part 4] The maximum current values and the restart times in the normal state, in the shortage state, and in the power interruption state may be set on the basis of the status of electricity consumers belonging to a customer.

More specifically, the maximum current values and the restart times in the normal state, in the shortage state, and in the power interruption state may be set on the basis of the number of electricity consumers (for example, the number of family members living together). The maximum current value and the restart time for a customer having children or elderly people may be set preferentially over other customers.

Figure 2:
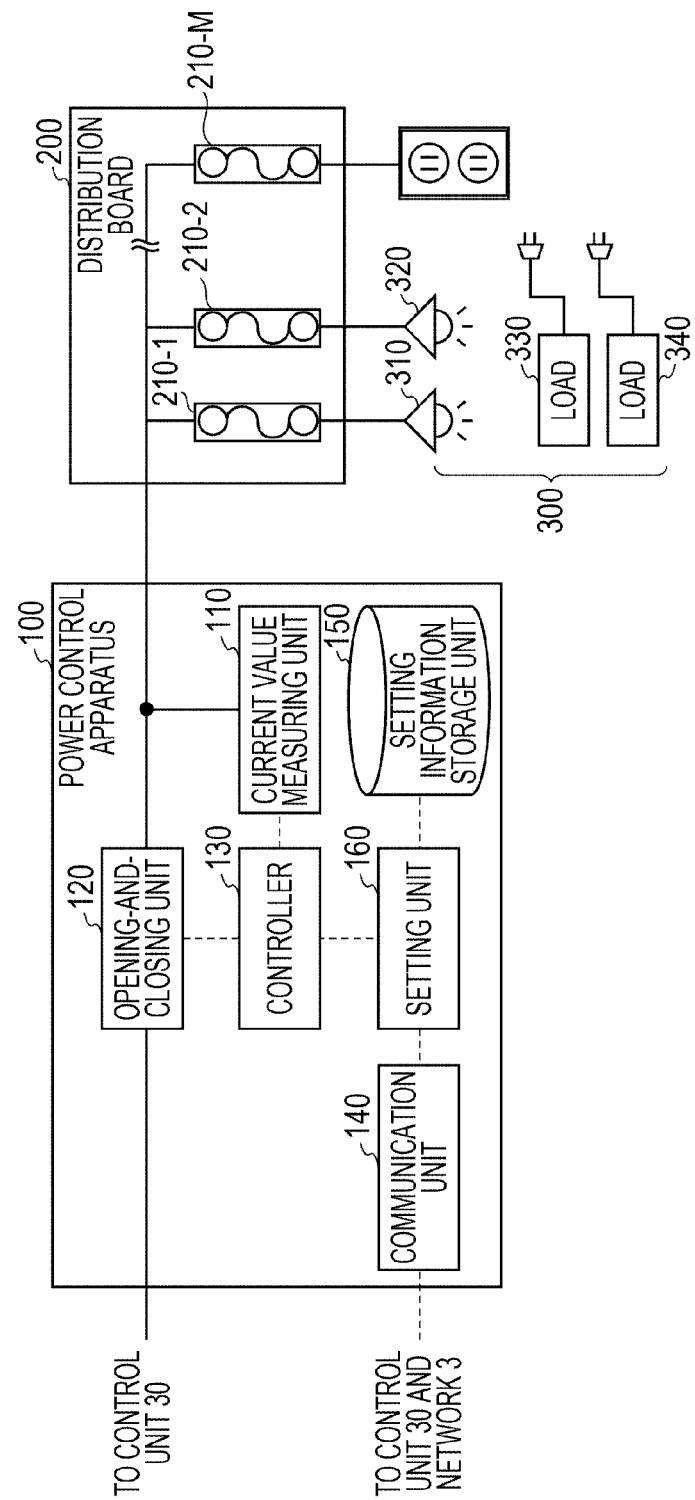
FIG. 2 is a diagram illustrating the configurations of a power control apparatus and a distribution board according to the first embodiment.

A description will be back to the configuration of the power control apparatus 100 by referring to FIG. 2.

In accordance with whether the power supply state is the normal state, the shortage state, or the power interruption state, the setting unit 160 sets the maximum current value stored in the setting information storage unit 150 as the maximum current control value used by the controller 130, and sets the restart time stored in the setting information storage unit 150 as the restart control time used by the controller 130.

This will be discussed more specifically. Upon receiving information indicating that (i) the power supply state is the shortage state by the communication unit 140, the setting unit 160 sets the maximum current value and the restart time for the shortage state stored in the setting information storage unit 150 as the maximum current control value and the restart control time, respectively, used by the controller 130. Upon receiving information indicating that (ii) the power supply state is the power interruption state by the communication unit 140, the setting unit 160 sets the maximum current value and the restart time for the power interruption state stored in the setting information storage unit 150 as the maximum current control value and the restart control time, respectively, used by the controller 130. Upon receiving information indicating that (iii) the power supply state is the recovery state or in the normal state by the communication unit 140, the setting unit 160 sets the maximum current value and the restart time for the normal state stored in the setting information storage unit 150 as the maximum current control value and the restart control time, respectively, used by the controller 130.

The controller 130, the communication unit 140, and the setting unit 160 may receive power from a power supply source different from the power supply system 1, or an emergency power supply source such as a battery may be provided so that power can be supplied even in the power interruption state.

The power supply system 1 may also include a UPS (Uninterruptible Power Supply), and the UPS may supply power to the controller 130, the communication unit 140, and the setting unit 160 in the case of the power interruption state. The UPS is a device including a battery or a generator and having a function of supplying power to hardware that requires power in the case of the power interruption state.

It is necessary that the setting information storage unit 150 retain information stored in the setting information storage unit 150 even in the case of the power interruption state. Accordingly, a non-volatile memory may be used for the setting information storage unit.

Distribution boards 200-1 through 200-N will now be described below.

The distribution board 200 includes M breakers 210-1 through 210-M. M is a desired number.

On the downstream side of the breakers 210-1 through 210-M, loads 310, 320, 330, and 340, for example, lights such as room lamps or electrical home appliances, are provided. The load set 300 shown in FIG. 1 is a set of these loads.

Each of the breakers 210-1 through 210-M disconnects the power supply path if an abnormal current flows through the downstream side.

The operation of the power control apparatus 100 according to this embodiment will be described below.

Figure 4:
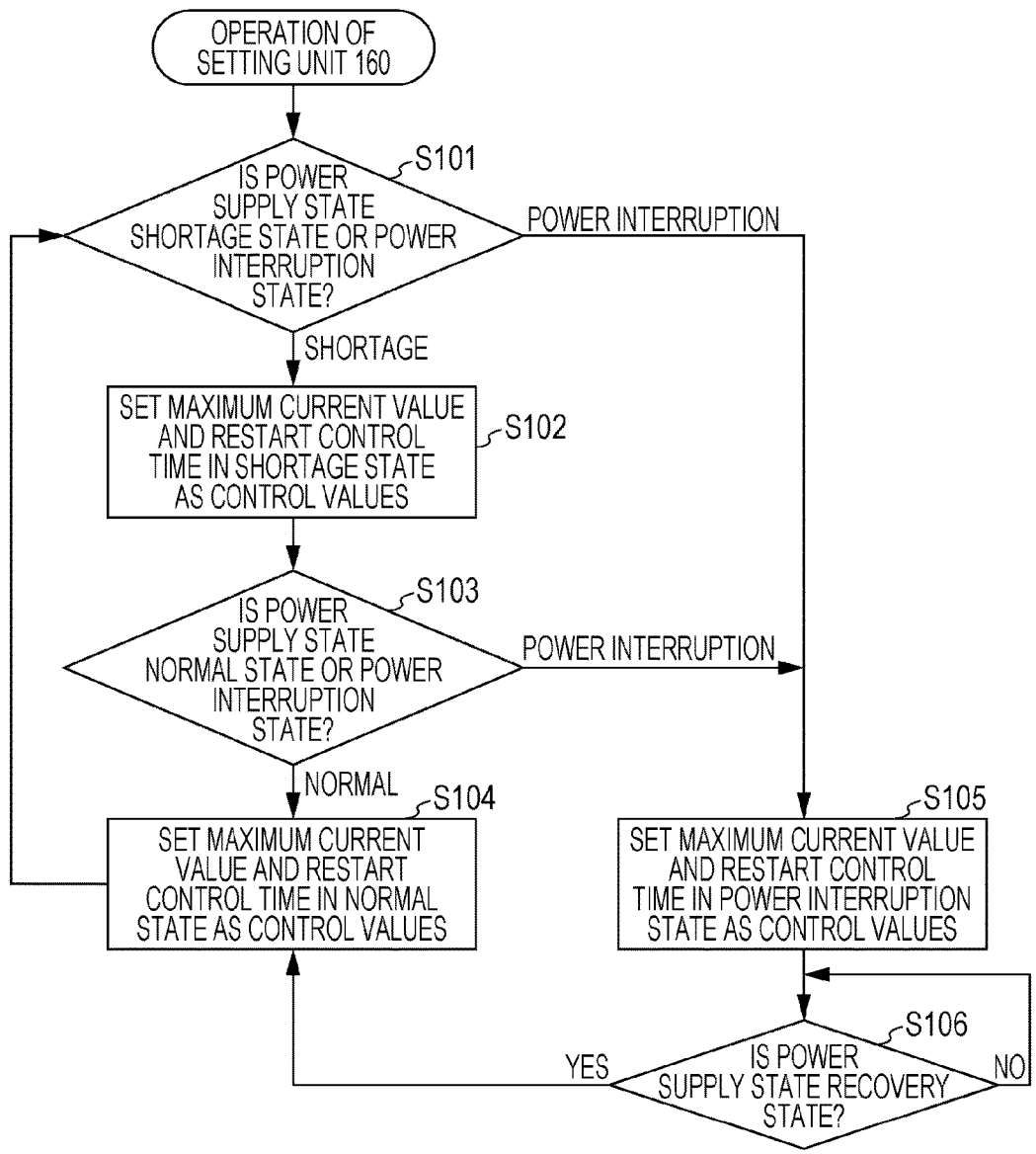
FIG. 4 is a flowchart illustrating an operation performed by a setting unit according to the first embodiment.

The operation performed by the setting unit 160 of the power control apparatus 100 will first be discussed below with reference to the flowchart of FIG. 4.

It is assumed that, as the initial settings, the maximum current value and the restart time in the normal state are set in advance as the maximum current control value and the restart control time used by the controller 130.

If, in step S101, information indicating that the power supply state is the shortage state is received by the communication unit 140 (S101: SHORTAGE), the setting unit 160 sets the maximum current value and the restart time corresponding to the shortage state stored in the setting information storage unit 150 as the maximum current control value and the restart control time used by the controller 130 (step S102).

If, in step S103, information indicating that the power supply state is the normal state is received by the communication unit 140 (S103: NORMAL), the setting unit 160 sets the maximum current value and the restart time corresponding to the normal state stored in the setting information storage unit 150 as the maximum current control value and the restart control time used by the controller 130 (step S104).

If, in step S101 or S103, information indicating that the power supply state is the power interruption state is received by the communication unit 140 (S101 or S103: POWER INTERRUPTION), the setting unit 160 sets the maximum current value and the restart time corresponding to the power interruption state stored in the setting information storage unit 150 as the maximum current control value and the restart control time used by the controller 130 (step S105).

If, in step S106, information indicating that the power supply state is the recovery state is received by the communication unit 140 (S106: YES), the setting unit 160 sets the maximum current value and the restart time in the normal state stored corresponding to the setting information storage unit 150 as the maximum current control value and the restart control time used by the controller 130 (step S104).

Figure 5:
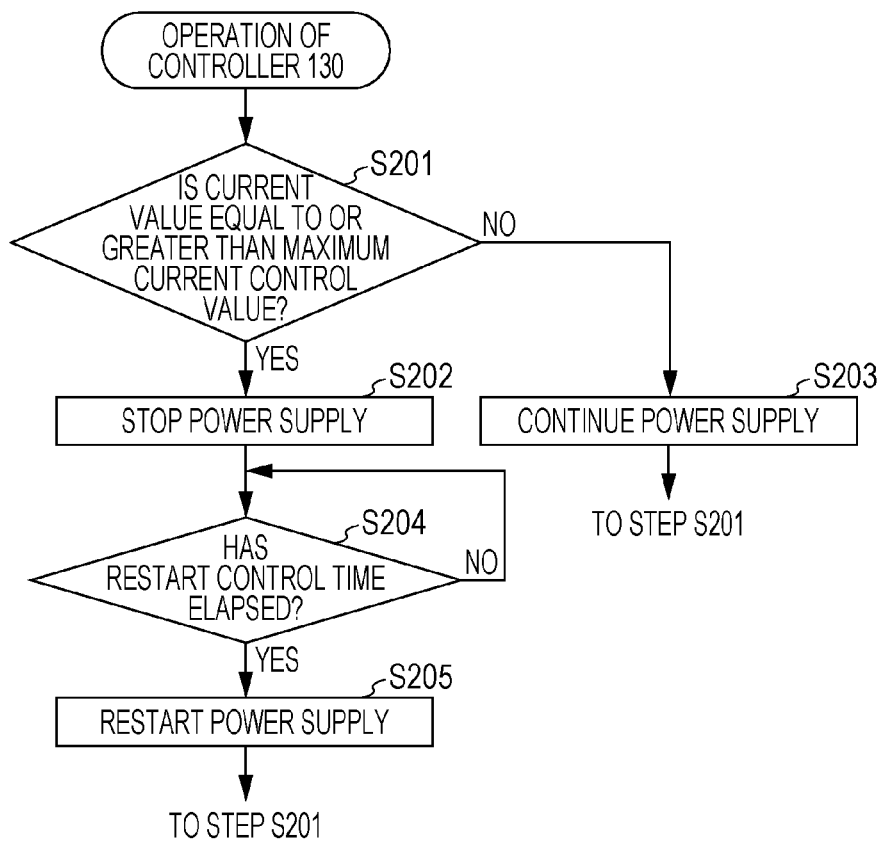
FIG. 5 is a flowchart illustrating an operation performed by a controller according to the first embodiment.

The operation performed by the controller 130 of the power control apparatus 100 will now be discussed below with reference to the flowchart of FIG. 5.

The controller 130 performs OFF control and ON control of the opening-and-closing unit 120, on the basis of the maximum current value and the restart time in the normal state, the shortage state, or the power interruption state which are set by the setting unit 160 as the maximum current control value and the restart control time.

If the controller 130 determines that the current value measured by the current value measuring unit 110 is equal to or greater than the set maximum current value (S201:

YES), it performs OFF control of the opening-and-closing unit 120 so as to stop supplying power to the load set (S202).

If the controller 130 determines that the set restart time has elapsed (S204: YES) after performing OFF control of the opening-and-closing unit 120 (S202), the controller 130 performs ON control of the opening-and-closing unit 120 so as to restart supplying power to the load set (S205).

In the power control apparatus of the first embodiment, as the maximum current control value and the restart control time used by the controller 130, the maximum current value and the restart time are set according to whether the power supply state is the normal state, the shortage state, or the power interruption state. Thus, it is possible to perform power supply control by considering the power supply state and the power supply capability of a power supply source.

More specifically, by setting the maximum current value in the shortage state to be smaller than that in the normal state, the power control apparatus 100 can restrict the maximum electric power to be supplied from a commercial power supply source to a load set in the case of the shortage state. By setting the restart time in the shortage state to be longer than that in the normal state, in the case of the shortage state, the power control apparatus 100 can take a longer time before restarting to supply power to the load set after power supply from the commercial power supply source to the load set has stopped, thereby making it possible to restrict the amount of power to be supplied from the commercial power supply source to the load set.

In the first embodiment, in the case of the power interruption state, a load set receives power from the storage battery system. However, since there are limitations in the charging capacity of the storage battery system or the conversion capacity of a power conditioner disposed in the storage battery system, the power supply capability of the storage battery system is generally lower than that of the commercial power supply source.

Accordingly, by setting the maximum current value in the power interruption state to be smaller than that in the normal state, the power control apparatus 100 can restrict the maximum electric power to be supplied from a storage battery system to a load set in the case of the power interruption state. By setting the restarting time in the power interruption state to be longer than that in the normal state, in the case of the power interruption state, the power control apparatus 100 can take a longer time before restarting to supply power to the load set after power supply from the storage battery system to the load set has stopped, thereby making it possible to restrict the amount of power to be supplied from the storage battery system to the load set.

In the power control apparatus of the first embodiment, the maximum electric power and the amounts of power to be supplied from the individual power supply sources to a load set can be controlled for each customer. It is thus possible to perform control suitable for each customer.

[2. Second Embodimeny]

The power control apparatus of the first embodiment includes an opening-and-closing unit and restricts the amount of power to be supplied to a load set. In contrast, a power control apparatus of a second embodiment controls the maximum electric power to be supplied to a load set by controlling an opening-and-closing unit disposed in a distribution board.

Figure 6:
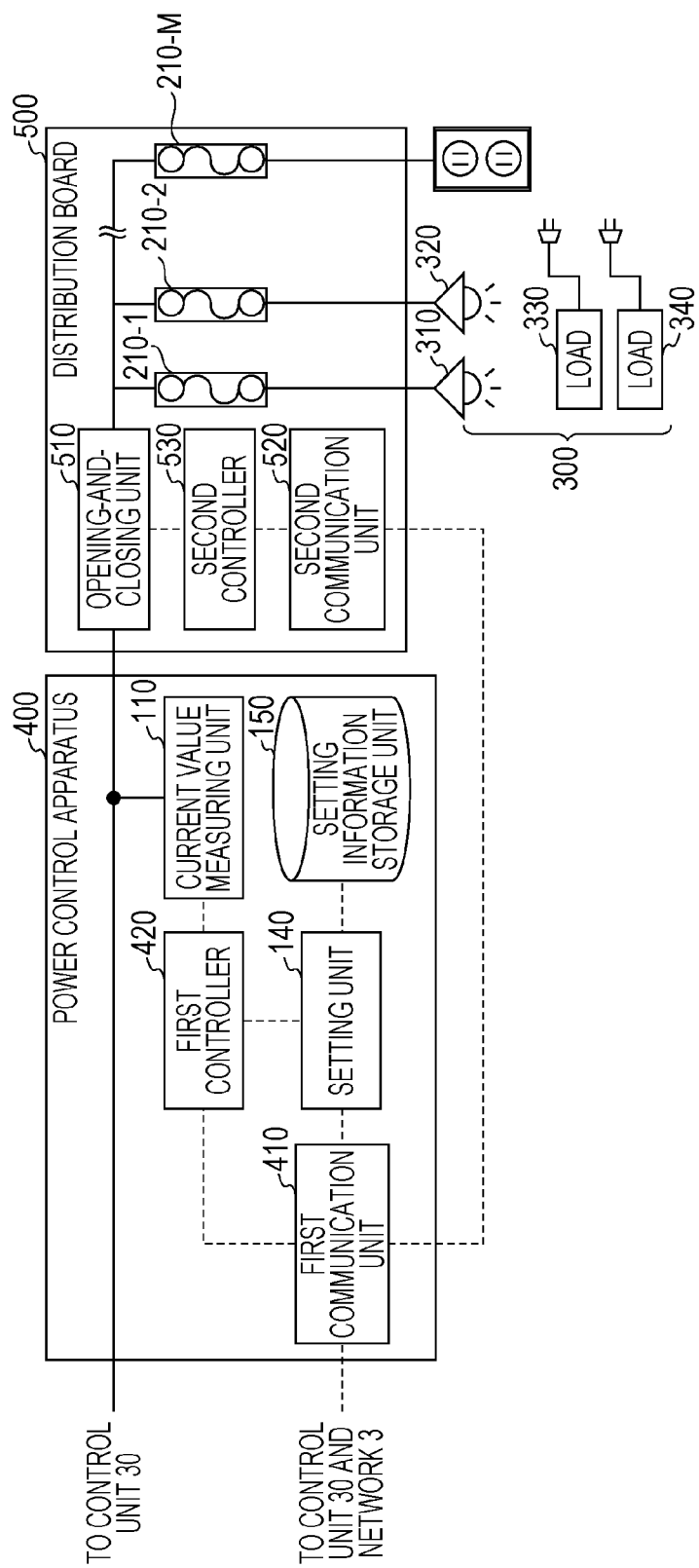
FIG. 6 is a diagram illustrating the configurations of a power control apparatus and a distribution board according to a second embodiment.

The configurations of the power control apparatus and a distribution board of the second embodiment will be described below with reference to FIG. 6. In the second embodiment, the configurations and operations similar to those of the power control apparatus 100 and the distribution board 200 of the above-described first embodiment are designated by like reference numerals, and an explanation thereof will thus be omitted.

A power control apparatus 400 includes a current value measuring unit 110, a setting information storage unit 150, a setting unit 160, a first communication unit 410, and a first controller 420.

A distribution board 500 includes an opening-and-closing unit 510, a second communication unit 520, a second controller 530, and breakers 210-1 through 210-M.

The first communication unit 410 receives various items of information from the control unit 30 and the network 3, in a manner similar to the communication unit 140 of the above-described first embodiment. The first communication unit 410 then sends instruction information concerning ON control or OFF control of the opening-and-closing unit 510 given by the first controller 420 to the second communication unit 520.

In a manner similar to the controller 130 of the power control apparatus 100 according to the above-described first embodiment, the first controller 420 performs ON control and OFF control of the opening-and-closing unit, on the basis of the maximum current value and the restart time which are set as the maximum current control value and the restart control time. However, the first controller 420 performs ON control and OFF control of the opening-and-closing unit 510 disposed in the distribution board 500 via the first communication unit 410, the second communication unit 520, and the second controller 530.

More specifically, when the first controller 420 determines that the current value measured by the current value measuring unit 110 is equal to or greater than the set maximum current control value, it causes the first communication unit 410 to send instruction information indicating an instruction to perform OFF control of the opening-and-closing unit 510. If the first controller 420 determines that the set restart control time has elapsed after sending the instruction information indicating an instruction to perform OFF control of the opening-and-closing unit 510 to the first communication unit, it causes the first communication unit 410 to send instruction information indicating an instruction to perform ON control of the opening-and-closing unit 510.

The opening-and-closing unit 510 is disposed in the power supply path to a load set, as in the opening-and-closing unit 120 of the power control apparatus 100 of the above-described first embodiment. The opening-and-closing unit 510 opens or closes the power supply path under the control of the second controller 530.

The second communication unit 520 receives, from the first communication unit 410 of the power control apparatus 400, instruction information concerning ON control or OFF control of the opening-and-closing unit 510 given by the first controller 420.

The second controller 530 performs OFF control or ON control of the opening-and-closing unit 510 in accordance with the instruction information received by the second communication unit 520.

In this manner, the power control apparatus 400 of this embodiment serves as a controller that controls the opening-and-closing unit 510 disposed in the distribution board 500.

[3. Third Embodiment]

The power control apparatus 100 of the above-described first embodiment includes the setting information storage unit 150, and, concerning the three states, that is, the normal state, shortage state, and power interruption state, the setting unit 160 sets maximum current values and restart times corresponding to the three states stored in the setting information storage unit 150 as the maximum current control values and the restart control times used by the controller 130.

In contrast, a power control apparatus of a third embodiment does not include a setting information storage unit 150, and, concerning the three states, that is, the normal state, shortage state, and power interruption state, the power control apparatus obtains maximum current values and restart times corresponding to the respective normal state, shortage state, and power interruption state from an external device. Then, the setting unit of the power control apparatus of the third embodiment sets the obtained maximum current values and restart times as the maximum current control values and the restart control times used by the controller.

A power control system of the third embodiment will be described below. In the third embodiment, the configurations and operations similar to those of the power supply system 1 and the power control apparatus 100 of the above-described first embodiment are designated by like reference numerals, and an explanation thereof will thus be omitted.

Figure 7:
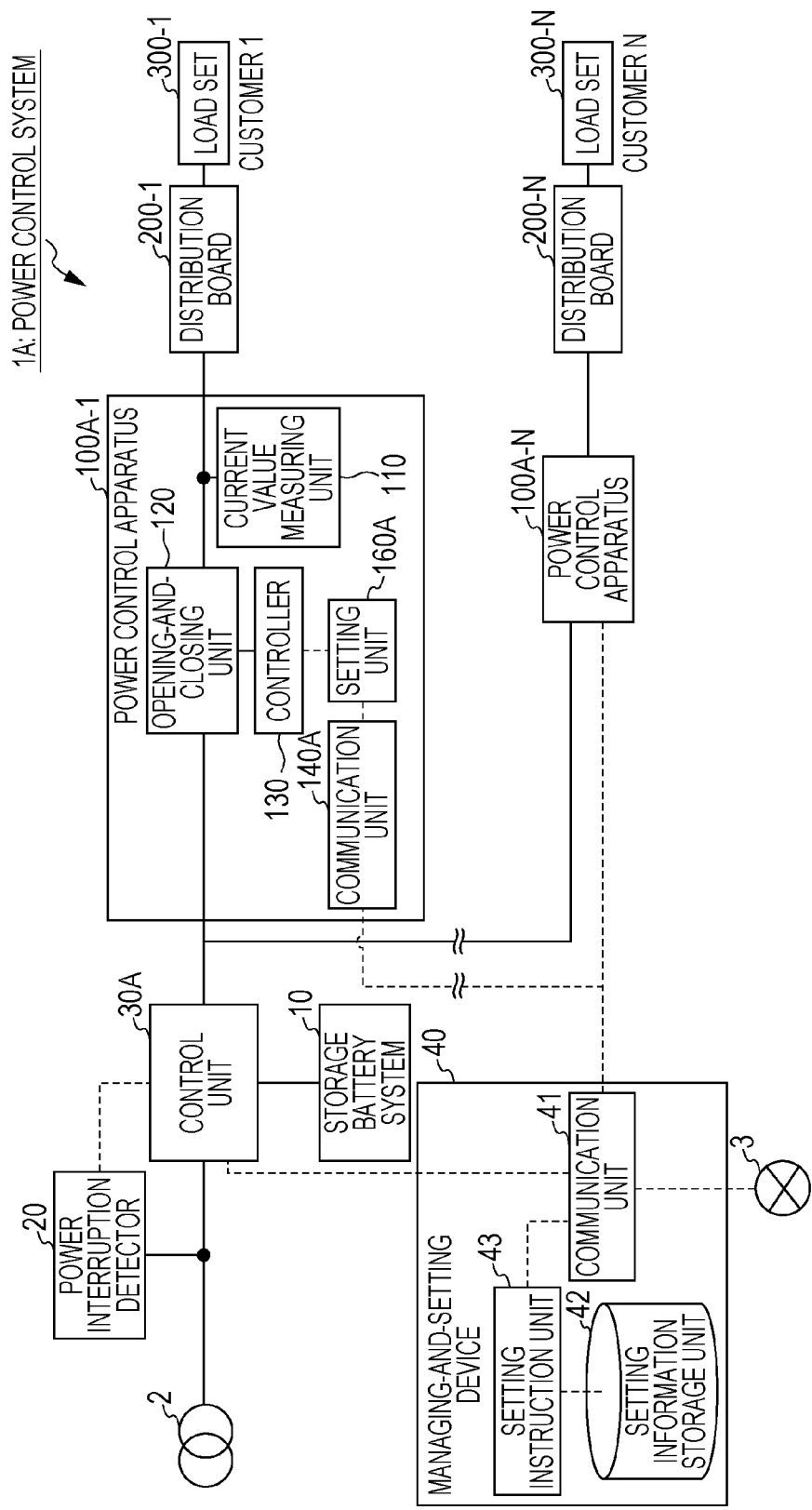
FIG. 7 is a diagram illustrating the configuration of a power control system according to a third embodiment.

The configuration of a power control system 1A of the third embodiment will be described below with reference to FIG. 7.

As in the power supply system 1 discussed in the above-described first embodiment, the power control system 1A supplies power from a commercial power supply source or the storage battery system 10 to individual load sets.

As in the control unit 30 of the power supply system 1 of the above-described first embodiment, a control unit 30A switches between power supply sources for load sets, that is, between the commercial power supply source and the storage battery system 10. In the above-described first embodiment, the control unit 30 sends information indicating whether the power supply state is the power interruption state or the recovery state to the power control apparatuses. However, the control unit 30A sends information indicating whether the power supply state is the power interruption state or the recovery state to a managing-and-setting device 40.

The managing-and-setting device 40 includes a communication unit 41, a setting information storage unit 42, and a setting instruction unit 43. Concerning the three states, that is, the normal state, shortage state, and power interruption state, the managing-and-setting device 40 causes the power control apparatus 100A to set maximum current values and restart times corresponding to the three states as the maximum current control values and the restart control times used by the controller 130 of the power control apparatus 100A. The power control apparatus 100A will be discussed later.

The communication unit 41 receives information indicating whether the power supply state is the power interruption state or the recovery state from the control unit 30A and receives information indicating whether the power supply state is the shortage state or the normal state from the network 3. The communication unit 41 also sends information indicating a maximum current value and a restart time determined by the setting instruction unit 43 and to be set in the controller 130 of a corresponding one of the power control apparatuses 100A-1 through 100A-N to the power control apparatus 100A. The setting instruction unit 43 will be discussed later.

As in the setting information storage unit 150 of the power control apparatus 100 of the above-described first embodiment, the setting information storage unit 42 stores therein maximum current values and restart times corresponding to the respective normal state, shortage state, and power interruption state. However, the setting information storage unit 42 stores the maximum current values and restart times to be set in the controllers of all the power control apparatuses 100A-1 through 100A-N together.

In the setting information storage unit 42, the same maximum current value and the same restart time may be set for the power control apparatuses 100A-1 through 100A-N, or different maximum current values and different start times may be set for the power control apparatuses 100A-1 through 100A-N.

For example, there may be a customer to which power is preferentially supplied. In this case, the maximum current value for the power control apparatus 100A associated with this customer may be set to be higher than those for the other customers, and the restart time for the power control apparatus 100A associated with this customer may be set to be shorter than those for the other customers. Conversely, the same maximum current value and the same restart time may be set for the power control apparatuses 100A-1 through 100A-N so that power can be equally supplied to all the customers corresponding to the power control apparatuses 100A-1 through 100A-N.

The setting information storage unit 42 may obtain update information concerning updated maximum current values and updated restart times from the control center of the power supply system 1A via the communication unit 41 and the network 3, and may be able to update the stored maximum current values and restart times.

The setting instruction unit 43 refers to the setting information storage unit 42, and determines, for each of the power control apparatuses 100A-1 through 100A-N, the maximum current value and the restart time to be set as the maximum current control value and the restart control time used by the controller 130 according to whether the power supply state is the normal state, the shortage state, or the power interruption state. Then, the setting instruction unit sends information indicating the determined maximum current value and restart time to the power control apparatus via the communication unit 41 so as to instruct the power control apparatus to set the maximum current control value and the restart control time used by the controller 130.

This will be discussed more specifically. Upon receiving information indicating that (i) the power supply state is the shortage state by the communication unit 41, the setting instruction unit 43 determines, for each of the power control apparatuses 100A-1 through 100A-N, the maximum current value and the restart time to be set as the maximum current control value and the restart control time used by the controller 130 to be the maximum current value and the restart time corresponding to the shortage state for a corresponding power control apparatus stored in the setting information storage unit 42. Then, the setting instruction unit 43 causes the communication unit 41 to send information indicating the determined maximum current value and restart time to each of the power control apparatuses 100A-1 through 100A-N.

Upon receiving information indicating that (ii) the power supply state is the power interruption state or (iii) the power supply state is the recovery state or the normal state by the communication unit 41, by taking a procedure similar to that taken upon receiving information indicating that (i) the power supply state is the shortage state, the setting instruction unit 43 instructs each of the power control apparatuses 100A-1 through 100A-N to set the maximum current control value and the restart control time used by the controller 130.

Upon receiving information indicating that (ii) the power supply state is the power interruption state by the communication unit 41, the setting instruction unit 43 determines the maximum current value and the restart time to be set as the maximum current control value and the restart control time used by the controller 130 to be the maximum current value and the restart time corresponding to the power interruption state for a corresponding power control apparatus stored in the setting information storage unit 42. Upon receiving information indicating that (iii) the power supply state is the recovery state or the normal state by the communication unit 41, the setting instruction unit 43 determines the maximum current value and the restart time to be set as the maximum current control value and the restart control time used by the controller 130 to be the maximum current value and the restart time corresponding to the normal state for a corresponding power control apparatus stored in the setting information storage unit 42.

The power control apparatus 100A includes a current value measuring unit 110, an opening-and-closing unit 120, a controller 130, a communication unit 140A, and a setting unit 160A.

The communication unit 140A receives, from the communication unit 41 of the managing-and-setting device 40, information indicating the maximum current value and the restart time corresponding to the normal state, the shortage state, or the power interruption state, which are set as the maximum current control value and the restart control time used by the controller 130.

The setting unit 160A sets the maximum current value received by the communication unit 140A as the maximum current control value of the controller 130 and sets the restart time received by the communication unit 140A as the restart control time of the controller 130.

In the power control system of the third embodiment, by using the managing-and-setting device 40, as the maximum current control value and the restart control time used by the controller 130 of each power control apparatus, the maximum current value and the restart time are set according to whether the power supply state is the normal state, the shortage state, or the power interruption state. Thus, it is possible to perform power supply control for each load set by considering the power supply state.

In the power control system of the third embodiment, centralized power supply control for individual load sets can be managed by an external device (managing-and-setting device 40).

[4. Fourth Embodiment]

In the above-described embodiments, a load set receives electric power from a commercial power supply source or a storage battery system. In this case, electricity charges for the commercial power supply source and those for the storage battery system may be different. The load set may also receive electric power from another distributed power supply source (for example, a photovoltaic power generation system) in addition to the commercial power supply source and the storage battery system.

In this manner, if a load set receives electric power from a plurality of power supply sources and if the electricity charge per unit of energy is different among the plurality of power supply sources, a billing system reflecting such differences is necessary.

From this viewpoint, it is an object of a fourth embodiment to provide a billing system that calculates electricity charges in accordance with the power supply source from which a customer receives power and in accordance with the electricity charge per unit of energy for each power supply source.

Figure 8:
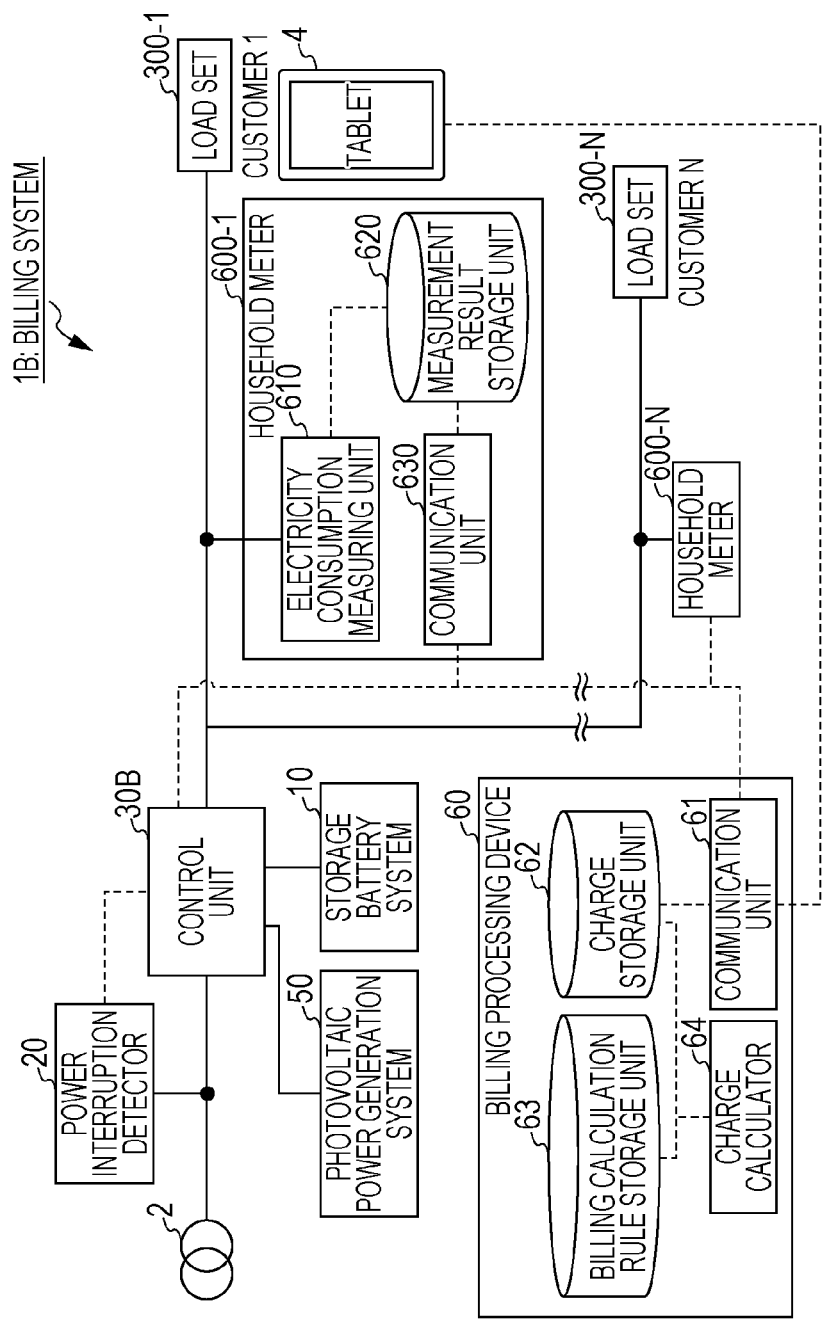
FIG. 8 is a diagram illustrating a billing system according to a fourth embodiment.

A billing system 1B of the fourth embodiment will be described below with reference to FIG. 8. In the fourth embodiment, the configurations and operations similar to those of the above-described embodiments are designated by like reference numerals, and an explanation thereof will thus be omitted.

In the fourth embodiment, it is assumed that a customer receives power from a commercial power supply source in the normal state or in the shortage state, and receives power from a distributed power supply source, such as the battery storage system 10 or a photovoltaic power generation system 50 in the power interruption state.

As in the control unit 30 of the above-described first embodiment, a control unit 30B switches between power supply sources for load sets. However, in the power interruption state, the control unit 30B switches the power supply source for a load set from the commercial power supply source to a distributed power supply source corresponding to a customer using the load set.

The control unit 30B also sends each of household meters 600-1 through 600-N, which will be discussed later, information concerning the switching of power supply sources for a load set (customer) associated with a corresponding household meter 600.

The photovoltaic power generation system 50 generates electric power from solar energy and supplies the generated electric power to customers. The photovoltaic power generation system 50 may also have a function of charging generated power, or may cause the storage battery system 10 to charge generated power.

The household meters 600-1 through 600-N are installed for respective customers, and each measure the amount of electric power consumed by a corresponding load set of the associated customer, and each inform a billing processing device 60 of the measurement value. The billing processing device 60 will be discussed later.

Each of the household meters 600-1 through 600-N includes an electricity consumption measuring unit 610, a measurement result storage unit 620, and a communication unit 630.

The electricity consumption measuring unit 610 measures the amount of electric power supplied from each power supply source to a load set disposed on the downstream side of the electricity consumption measuring unit 610 and stores the measurement value in the measurement result storage unit 620.

More specifically, the electricity consumption measuring unit 610 obtains information concerning the switching of power supply sources from the control unit 30B via the communication unit 630, and stores the measurement value in the measurement result storage unit 620 in accordance with the power supply source. The communication unit 630 will be discussed later.

The measurement result storage unit 620 stores a value of electric power measured by the electricity consumption measuring unit 610 in accordance with the power supply source.

FIG. 9 illustrates an example of information stored in the measurement result storage unit 620.

As shown in FIG. 9, in the measurement result storage unit 620, the fields "date" and "electricity consumption" are included, and the field "electricity consumption" includes the subfields "commercial power supply source", "storage battery system", and "photovoltaic power generation system".

A specific example of the operation of the electricity consumption measuring unit 610 and the measurement result storage unit 620 will be discussed below with reference to FIG. 9.

For example, it is assumed that the electricity consumption measuring unit 610 has obtained, via the communication unit 630, information indicating that the power supply source for a load set was switched from the commercial power supply source to the storage battery system in a time period (14:00 to 15:00 on Jan. 1, 2013). In this case, the electricity consumption measuring unit 610 stores the value of electric power measured in a time period from the time (14:00 on Jan. 1, 2013) until the time when this information was obtained in the subfield "commercial power supply source" of the measurement result storage unit 620. Then, the electricity consumption measuring unit 610 stores the value of electric power measured in a time period from the time when this information was obtained until the time (15:00 on Jan. 1, 2013) in the subfield "storage battery system" of the measurement result storage unit 620.

An example of the operation when the power supply source for a load set is switched from the commercial power supply source to the storage battery system has been given. The operation to be performed when the power supply source for a load set is switched from the commercial power supply source to the photovoltaic power generation system, from the storage battery system to the commercial power supply source or the photovoltaic power generation system, or from the photovoltaic power generation system to the commercial power supply source or the storage battery system is similar to the above-described operation example.

The communication unit 630 receives information concerning the switching of power supply sources for a load set from the control unit 30B. The communication unit 630 also sends, on a regular basis, the values of electric power measured by the electricity consumption measuring unit 610 and stored in the measurement result storage unit 620 to the billing processing device 60, which will be discussed below.

The billing processing device 60 includes a communication unit 61, a charge storage unit 62, a billing calculation rule storage unit 63, and a charge calculator 64.

The communication unit 61 receives, on a regular basis, the values of electric power measured by the electricity consumption measuring unit 610 from each of the household meters 600-1 through 600-N, and stores the received values in the charge storage unit 62 in accordance with the household meter.

The charge storage unit 62 stores the value of electric power measured by the electricity consumption measuring unit 610 of each of the household meters 600-1 through 600-N and received by the communication unit 61 in accordance with the household meter.

The charge storage unit 62 also stores the electricity charge to each household meter calculated by the charge calculator, which will be discussed later.

FIG. 10 illustrates an example of information stored in the charge storage unit 62.

In FIG. 10, in the charge storage unit 62, the fields "household meter ID" and "customer ID" are included, and the household meter ID and the customer ID are stored in association with each other. In the charge storage unit 62, the fields "date", "electricity consumption" and "charge" of the commercial power supply source, and "electricity consumption" and "charge" of the storage battery system are also included. The measured electricity consumption is stored for each power supply source, and the electricity charge for each item of electricity consumption is stored in association with the electricity consumption. In the charge storage unit 62, the field "total charge" is included, and the total of the electricity charge for the commercial power supply source and the electricity consumption for the storage battery system is stored.

The billing calculation rule storage unit 63 stores billing calculation rules applied to each customer and used for calculating the electricity charge by the charge calculator 64, which will be discussed later.

Figure 11:
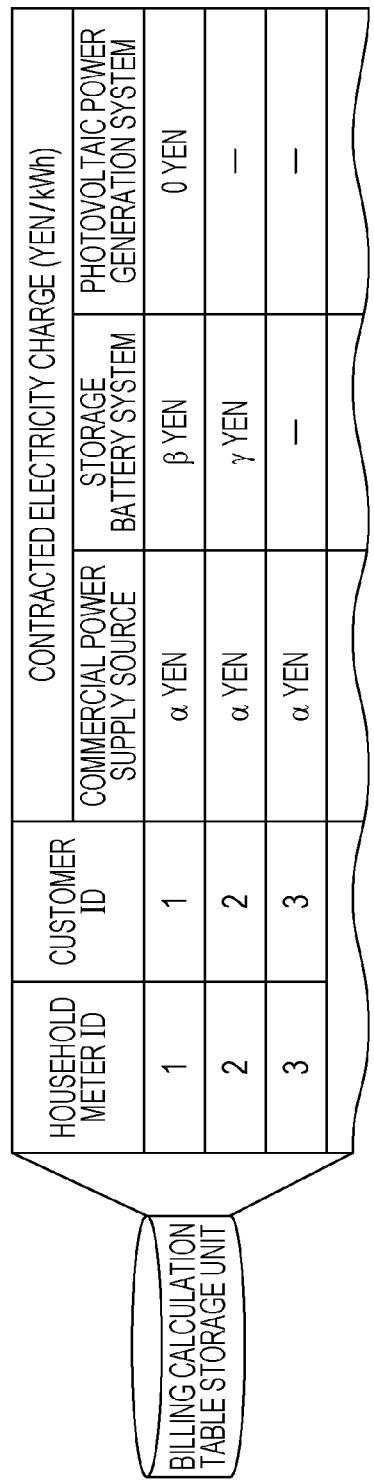
FIG. 11 illustrates an example of information stored in a billing calculation rule storage unit according to the fourth embodiment.

FIG. 11 illustrates an example of the billing calculation rules applied to each customer stored in the billing calculation rule storage unit 63.

In FIG. 11, in the billing calculation rule storage unit 63, the fields "household meter ID", "customer ID", and "contracted electricity charge" are included, and information concerning the contracted electricity charge for each customer is stored. The field "contracted electricity charge" includes the subfields "commercial power supply source", "storage battery system", and "photovoltaic power generation system". The billing calculation rule storage unit 63 stores the contracted electricity charge (yen/kWh) to a customer in accordance with the power supply source.

In FIG. 11, for a customer ID1 associated with a household meter ID1, the contracted electricity charge for the commercial power supply source is $\alpha$ (yen/kWh), and the contracted electricity charge for the storage battery system is $\beta$ (yen/kWh).

In the fourth embodiment, the commercial power supply source is a main power supply source that supplies power to a load set in the case of the normal state or the shortage state. The storage battery system 10 is a sub power supply source that supplies power to a load set in the case of the power interruption state.

Accordingly, the contracted electricity charge $\beta$ (yen/kWh) for the storage battery system may be set to be higher than the contracted electricity charge $\alpha$ (yen/kWh) for the commercial power supply source ($\beta > \alpha$), thereby encouraging the customers to save electricity in the case of the power interruption state.

As shown in FIG. 11, the contracted electricity charge for the photovoltaic power generation system may be set to be 0 (yen/kWh). Alternatively, a usage charge for the photovoltaic power generation system may be billed to the customers as a fixed rate.

In the fourth embodiment, the customers receive power from the commercial power supply source in the case of the normal state or the shortage state and receive power from a distributed power supply source, such as the storage battery system 10 or the photovoltaic power generation system 50, in the case of the power interruption state. However, the customers may receive power in a different manner.

As shown in FIG. 11, the power supply sources that supply power may differ among the customers, for example, the customer ID1 receives power from the commercial power supply source, the storage battery system, and the photovoltaic power generation system, and the customer ID2 receives power from the commercial power supply source and the storage battery system, but not from the photovoltaic power generation system.

The charge calculator 64 calculates the electricity charge for electric power measured by each household meter, on the basis of the electricity consumption stored in the charge storage unit 62 and information concerning the contracted electricity charge to each customer stored in the billing calculation rule storage unit 63.

An example of the charge calculation method employed by the charge calculator 64 will be discussed below with reference to FIGS. 10 and 11.

For example, FIG. 11 shows that electric power supplied from the commercial power supply source and consumed by the customer ID1 associated with the household meter ID1 in the time period (14:00 to 15:00 on Jan. 1, 2013) is 18.0 (kWh). FIG. 10 shows that the contracted electricity charge to the customer ID1 for the commercial power supply source is $\alpha$ (yen/kWh).

In this case, the charge calculator 64 calculates the electricity charge to the customer ID1 for the commercial power supply in the time period (14:00 to 15:00 on Jan. 1, 2013) as the electricity charge (yen)=18.0 (kWh)$\times\alpha$ (yen/kWh), and stores the calculation result in the charge storage unit 62.

Electric power supplied from the storage battery system 10 and consumed by the customer ID1 associated with the household meter ID1 in the time period (14:00 to 15:00 on Jan. 1, 2013) is 1.0 (kWh). FIG. 10 shows that the contracted electricity charge to the customer ID2 for the storage battery system 10 is $\beta$ (yen/kWh).

In this case, the charge calculator 64 calculates the electricity charge to the customer ID1 for the storage battery system 10 in the time period (14:00 to 15:00 on Jan. 1, 2013) as the electricity charge (yen)=1.0 (kWh)$\times\beta$ (yen/kWh), and stores the calculation result in the charge storage unit 62.

The charge calculator 64 also calculates the total electricity charge in the time period (01:00 to 01:30 on Jan. 1, 2013) as the total electricity charge (yen)=(the above-described calculation result of the electricity charge for the commercial power supply source)+(the above-described calculation result of the electricity charge for the storage battery system)=$((18.0\times\alpha)+(1.0\times\beta))$ yen, and stores the calculation result in the charge storage unit 62.

The communication unit 61 may send information concerning the electricity consumption and the electricity charge to each customer calculated for each power supply source and stored in the charge storage unit 62 to terminals that are accessible by individual customers (for example, a tablet 4 (FIG. 8) of the customer ID1).

A terminal accessible by a customer may receive information concerning the electricity consumption and the electricity charge to this customer calculated for each power supply source from the communication unit 61 and may display the received information.

On the basis of the information received from the communication unit 61, a graph indicating the transition in the electricity consumption and the electricity charge may be generated and displayed on the terminal.

The charge calculator 64 may calculate the electricity consumption and the electricity charge per day for each power supply source, or the total electricity consumption and the total electricity charge per day. The charge calculator 64 may also calculate the difference in the electricity consumption and the electricity charge between a certain day and the previous day. Then, the communication unit 61 may send information concerning the calculations made by the charge calculator to the terminals accessible by individual customers and may display the information on the terminals.

In this manner, the billing system of the fourth embodiment can calculate the electricity charge to be paid by each customer in accordance with the power supply source from which the customer receives power and in accordance with the electricity charge for each power supply source. In the billing system of the fourth embodiment, it is possible to provide detailed information concerning the electricity consumption and the electricity charge to each customer through the use of a terminal accessible by a customer.

[5. Fifth Embodiment]

In the above-described fourth embodiment, a billing system that calculates the electricity charge to each customer in accordance with the power supply source from which the customer receives power and in accordance with the electricity charge for each power supply source has been discussed.

In a fifth embodiment, a housing complex is assumed, and a billing system that calculates electricity charges in a case in which electric power is supplied from a commercial power supply source to the entire housing complex through high-voltage electricity bulk reception will be described specifically.

Figure 12:
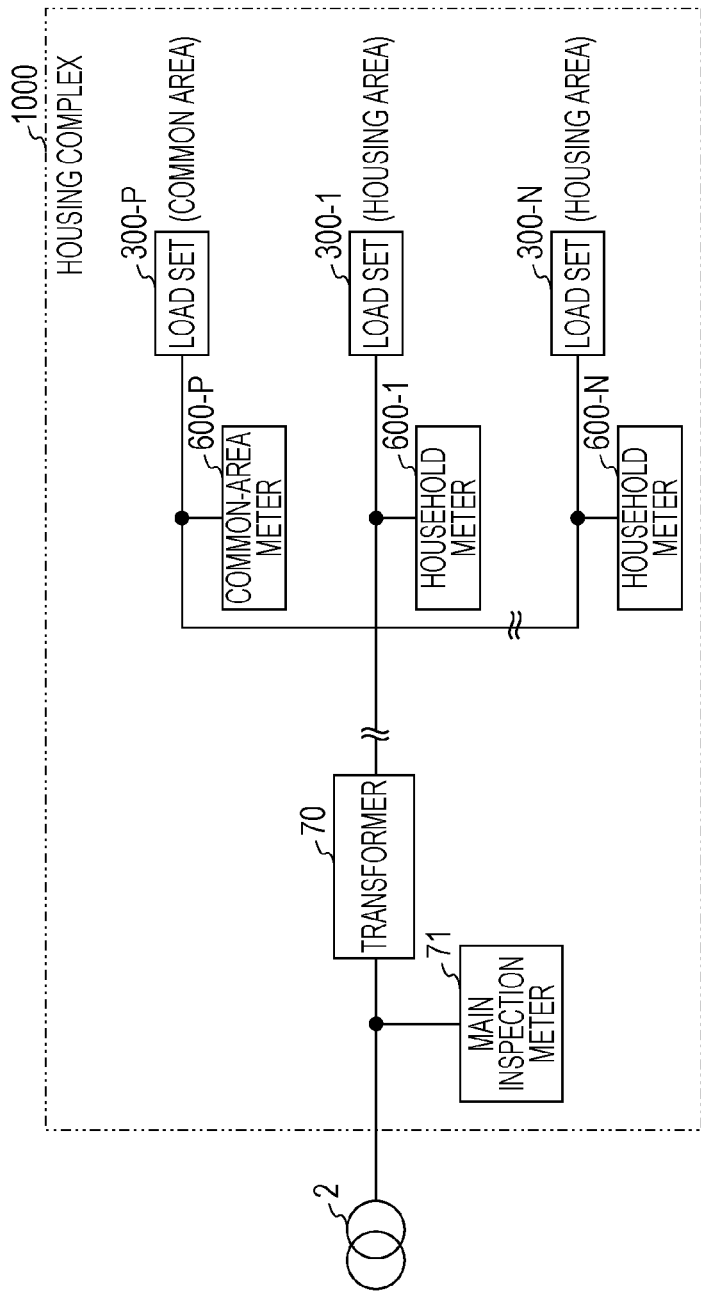
FIG. 12 is a diagram illustrating a housing complex according to a fifth embodiment.

A power supply system and a billing system for a housing complex 1000 according to the fifth embodiment will be described below with reference to FIG. 12.

In the fifth embodiment, the configurations and operations similar to those of the above-described embodiments are designated by like reference numerals, and an explanation thereof will thus be omitted.

It is assumed that the housing complex 1000 receives power from a commercial power supply source and a distributed power supply source via a high-voltage electricity bulk purchaser.

A high-voltage electricity bulk purchaser purchases high-voltage electricity in bulk from a certain electric power company (hereinafter simply referred to as an "electric power company") and supplies the purchased electricity to a housing complex.

In the housing complex 1000, as in the above-described fourth embodiment (FIG. 8), a load set in a common area and load sets in housing areas receive power from the commercial power supply source in the case of the normal state or the shortage state and receive power from a distributed power supply source, such as the storage battery system 10 or the photovoltaic power generation system 50, in the case of the power interruption state.

"A load set in a common area" is a set of loads which are used by all residents in the housing complex (for example, an elevator and a service water pump). "Load sets in housing areas" are sets of loads which are individually used by residents of the housing areas in the housing complex.

A transformer 70 steps-down electricity supplied from the commercial power supply source through high-voltage electricity bulk reception so as to supply electric power to loads, such as electrical home appliances.

A main inspection meter 71 measures electric power supplied from the commercial power supply source through high-voltage electricity bulk reception and consumed in the entire housing complex. The main inspection meter 71 then informs the electric power company of the measurement values on a regular basis.

As the transformer 70 and the main inspection meter 71, cubicle high-voltage electricity reception equipment may be used.

A common-area meter 600-P measures electric power consumed by the load set in the common area, as in the household meter 600.

In the fifth embodiment, the household meters 600-1 through 600-N are individually installed in the housing areas and each measure electric power consumed by a load set used by a resident in a housing area (hereinafter simply referred to as "a resident").

An example of a billing method for billing electricity charges in a housing complex according to the fifth embodiment will be described below with reference to FIG. 13.

Figure 13:
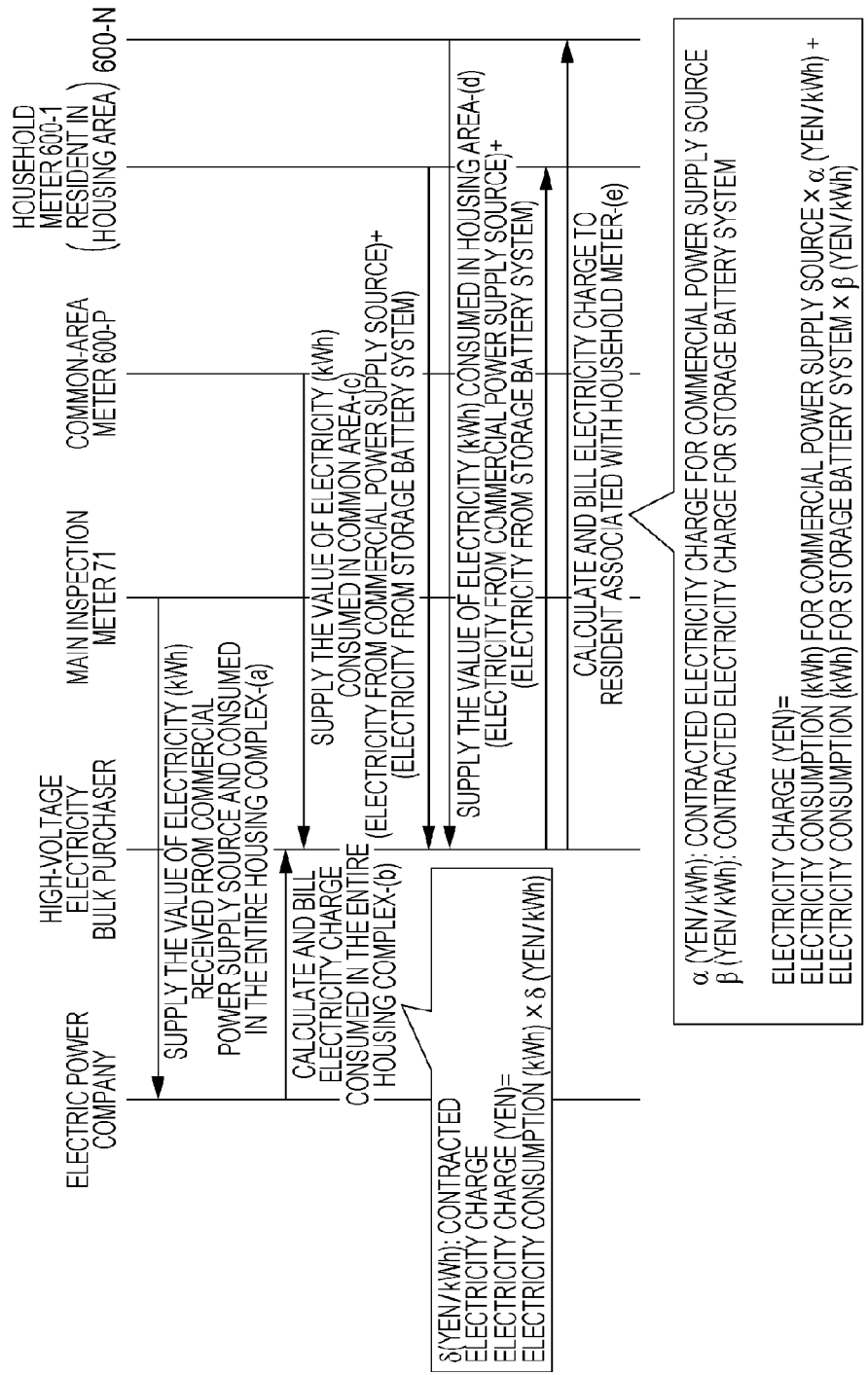
FIG. 13 is a diagram illustrating an example of a billing system according to the fifth embodiment.

As shown in FIG. 13, the main inspection meter 71 informs, on a regular basis, an electric power company of the measurement value of electric power supplied from the commercial power supply source and consumed in the entire housing complex (FIG. 13(a)).

The electric power company calculates the electricity charge to the high-voltage electricity bulk purchaser for electric power consumed in the entire housing complex, on the basis of the value of electricity consumption supplied from the main inspection meter 71 in FIG. 13(a) and a contract made with the high-voltage electricity bulk purchaser. The electric power company then bills the high-voltage electricity bulk purchaser for the calculated electricity charge (FIG. 13(b)).

In FIG. 13(b), it is assumed that, for example, the contracted electricity charge is set to be δ (yen/kWh) based on the contract between the electric power company and the high-voltage electricity bulk purchaser. In this case, the electric power company may calculate the electricity charge to be billed to the high-voltage electricity bulk purchaser as the electricity charge (yen)=electricity consumption (kWh) in the entire housing complex measured by the main inspection meter 71×δ (yen/kWh).

The type of contract between the electric power company and the high-voltage electricity bulk purchaser is not restricted to the above-described contract. For example, the contracted electricity charge per electricity consumption may differ depending on the number of times the electricity consumption has exceeded a preset peak threshold.

The common-area meter 600-P informs, on a regular basis, the high-voltage electricity bulk purchaser of the measurement value of electric power consumed by the load set in the common area by distinguishing electric power supplied from the commercial power supply source from electric power supplied from a distributed power supply source (FIG. 13(c)).

The household meters 600-1 through 600-N each inform, on a regular basis, the high-voltage electricity bulk purchaser of the measurement value of electric power consumed by the load set in the housing area by distinguishing electric power supplied from the commercial power supply source from electric power supplied from a distributed power supply source (FIG. 13(d)).

For each of the household meters 600-1 through 600-N, the high-voltage electricity bulk purchaser calculates the electricity charge to a household meter and the associated resident, on the basis of the measurement value of electricity consumption supplied from the household meter (FIG. 13(d)) and a contract made between the high-voltage electricity bulk purchaser and the household meter and the associated resident. The high-voltage electricity bulk purchaser then bills the calculated electricity charge to the resident (FIG. 13(e)).

In FIG. 13(e), it is assumed that, for example, the contracted electricity charge for the consumption of electric power supplied from the commercial power supply source is set to be α (yen/kWh) and the contracted electricity charge for the consumption of electric power supplied from the storage battery system is set to be β (yen/kWh), based on a contract between the high-voltage electricity bulk purchaser and a resident. In this case, the high-voltage electricity bulk purchaser may calculate the electricity charge billed to this resident as the electricity charge (yen)=(electric power (kWh) supplied from the commercial power supply source and consumed by this resident×α (yen/kWh))+(electric power (kWh) supplied from the storage battery system and consumed by this resident×β (yen/kWh)).

The high-voltage electricity bulk purchaser may bill a resident for consumed electricity by including a basic charge. The basic charge may be set by considering a commission fee for the high-voltage electricity bulk purchaser and the electricity charge to the load set in the common area.

For example, the high-voltage electricity bulk purchaser may calculate the basic charge to a resident in the following manner. The high-voltage electricity bulk purchaser first calculates electric power (kWh) which may be considered to be consumed by a resident, on the basis of electric power consumed by the housing complex and electric power consumed for running the power reception system for the housing complex including electric power consumed by the load set in the common area, as electric power (kWh) which may be considered to be consumed by a resident=((electric power consumed by the entire housing complex (kWh))−(total electric power consumed by the individual households (kWh))/the number of households. Then, on the basis of this calculation result, the high-voltage electricity bulk purchaser calculates the basic charge to this resident to be added to the electricity charge.

The billing method for electricity charges in the housing complex according to the fifth embodiment is not restricted to the above-described method.

Another example of the billing method for billing electricity charges in a housing complex according to the fifth embodiment will be described below with reference to FIG. 14. The same content as that discussed with reference to FIG. 13 will not be explained.

Figure 14:
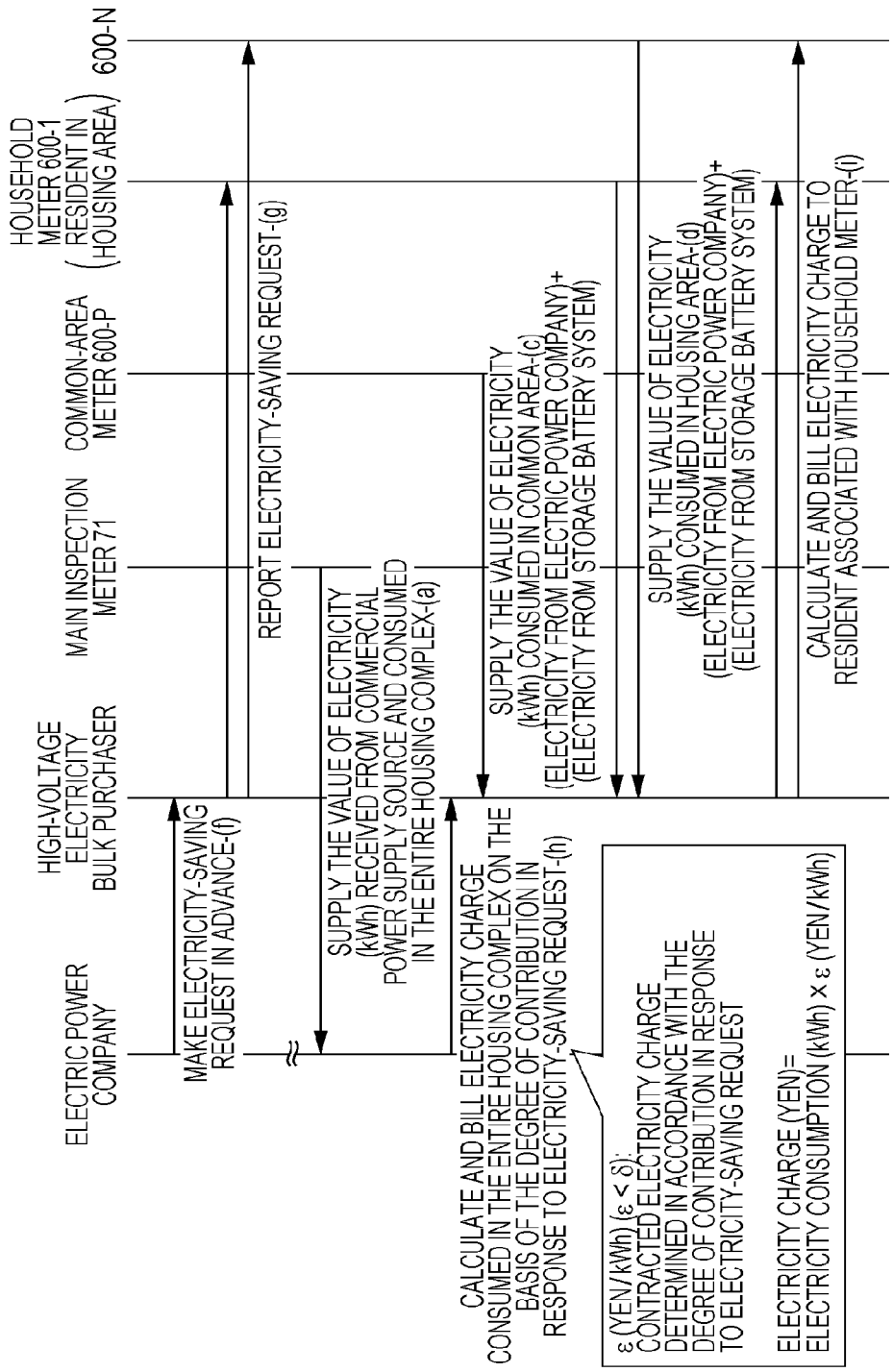
FIG. 14 is a diagram illustrating another example of the billing system according to the fifth embodiment.

As shown in FIG. 14, an electric power company requests a high-voltage electricity bulk purchaser to save electricity in a time period for which a shortage of electricity will likely to occur (FIG. 14(f)). The electric power company may make such an electricity-saving request on the previous day to save electricity on the following day.

The high-voltage electricity bulk purchaser reports the electricity-saving request received from the electric power company (FIG. 14(f)) to the individual residents (FIG. 14(g)).

As in FIG. 13(a), the main inspection meter 71 informs the electric power company of the measurement value of electricity (FIG. 14(a)).

As in FIG. 13(b), the electric power company calculates and bills the electricity charge to the high-voltage electricity bulk purchaser. However, concerning the time period for which electricity-saving was requested, the electric power company calculates the electricity charge to the high-voltage electricity bulk purchaser in accordance with the degree of contribution in response to the electricity-saving request (FIG. 14(h)).

In FIG. 14(h), the electric power company compares the value measured by the main inspection meter 71 in the time period for which electricity-saving was requested with that in the same time period of another day for which electricity-saving was not requested, and calculates the degree of contribution in response to the electricity-saving request. Then, the electric power company may discount the charge to the high-voltage electricity bulk purchaser in accordance with the calculated degree of contribution.

For example, it is assumed that the contracted electricity charge in a time period for which electricity-saving is not requested is set to be δ (yen/kWh), on the basis of a contract between the electric power company and the high-voltage electricity bulk purchaser. Then, the electric power company sets the electricity charge for a time period for which electricity-saving is requested to be ϵ (yen/kWh), which is lower than δ (yen/kWh) (ϵ<δ), in accordance with the degree of contribution in response to the electricity-saving request. Then, the electric power company may calculate the electricity charge to the high-voltage electricity bulk purchaser for the time period for which electricity-saving is requested as the electricity charge (yen)=electricity consumption (kWh) in the entire housing complex measured by the main inspection meter 71×ϵ (yen/kWh).

As in FIGS. 13(c) and 13(d), the common-area meter 600-P and the household meters 600-1 through 600-N each inform the high-voltage electricity bulk purchaser of the value of the measured electricity consumption (FIG. 14(c) and FIG. 14(d)).

As in FIG. 13(e), the high-voltage electricity bulk purchaser calculates and bills the electricity charge to each resident. However, concerning a time period for which electricity-saving was requested in advance, the high-voltage electricity bulk purchaser calculates the electricity charge to a resident in accordance with the degree of contribution given by this resident in response to the electricity-saving request (FIG. 14(i)).

In FIG. 14(i), as in FIG. 14(h), the high-voltage electricity bulk purchaser may calculate the degree of contribution in response to the electricity-saving request by comparing the value measured by the household meter in the time period for which electricity-saving was requested with that in the same time period of another day for which electricity-saving was not requested. Then, the high-voltage electricity bulk purchaser may discount the charge to the household meter and the associated resident in accordance with the calculated degree of contribution. The discount method for the electricity charge is not restricted to this approach. The electricity charge to each resident may be calculated, on the basis of the electricity charge calculated and billed for the time period for which electricity-saving was requested in FIG. 14(h), so that the residents can benefit from the discount.

In FIG. 14, as the degree of contribution in response to an electricity-saving request is higher, the electricity charge billed by the electric power company to the high-voltage electricity bulk purchaser or by the high-voltage electricity bulk purchaser to residents is discounted at a higher rate. However, the billing method is not restricted to this approach. For example, the electricity charge per electric power for a time period for which electricity-saving is requested may be set to be higher than that in a time period for which electricity-saving is requested.

[6. Modified Examples]

The apparatuses and systems discussed in the above-described embodiments may be modified in the following manner. In the following modified examples, the configurations and operations similar to those of the above-described embodiments are designated by like reference numerals, and an explanation thereof will thus be omitted.

(1) Concerning a combination of power supply sources for a load set used in the case of the normal state, shortage state, and power interruption state In the above-described embodiments, power is supplied from a commercial power supply source, which serves as a main power supply source, to a load set in the case of the normal state or the shortage state, and power is supplied from a distributed power supply source, such as a storage battery system, which serves as a sub power supply source, to a load set in the case of the power interruption state of the commercial power supply source. However, a combination of power supply sources used in the case of the normal state, shortage state, and power interruption state is not restricted to the above-described combination.

For example, not only in the power interruption state, but also in the shortage state, power may be supplied from a distributed power supply source to a load set.

A distributed power supply source may be used as a main power supply source for a load set. That is, when a certain distributed power supply source is in states other than the power interruption state, power may be supplied from this distributed power supply source to a load set, and when this distributed power supply source is in the power interruption state, power may be supplied from another distributed power supply source to a load set.

(2) Power control may be performed in accordance with two states, that is, the normal state and the shortage state.

In the above-described embodiments, the power control apparatuses and the power control systems perform power control in accordance with the three states, that is, the normal state, shortage state, and power interruption state. However, the power control apparatuses and the power control systems of the above-described embodiments may perform power control in a different manner. The power control apparatuses and the power control systems of the above-described embodiments may perform power control in accordance with two states, that is, the normal state and the shortage state, or the normal state and the power interruption state.

(3) A distributed power supply source, such as a storage battery system, may be provided for a household.

In the above-described embodiments, multiple customers share a storage battery system. However, one customer may own a storage battery system.

Figure 15:
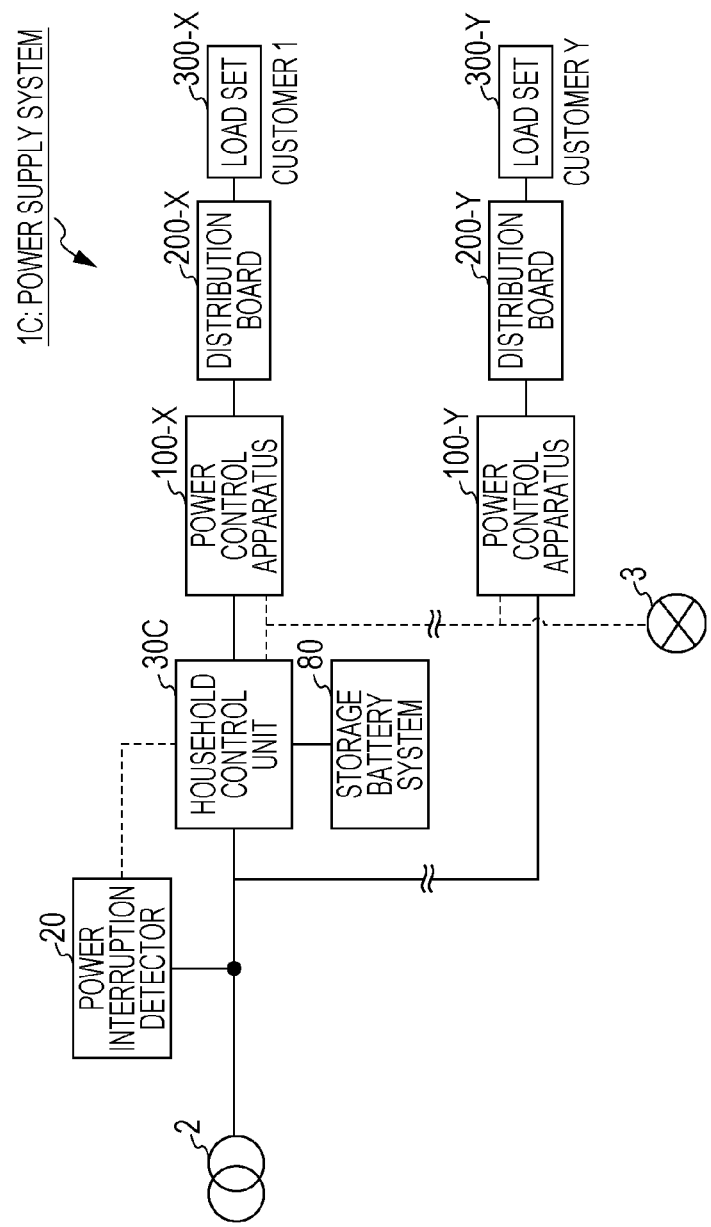
FIG. 15 is a diagram illustrating a power supply system according to modified example 3.

A power supply system 1C shown in FIG. 15 is an example of a power supply system in which one customer owns a storage battery system.

A storage battery system 80 includes functions similar to those of the storage battery system 10 of the above-described embodiments. However, the storage battery system 80 is a storage battery system owned by a customer X, and is connected to the power supply path of the household of the customer X so as to supply power to a load set 300-X of the customer X.

A household control unit 30C switches between power supply sources for a load set, in a manner similar to the control units of the above-described embodiments. However, the household control unit 30C switches between power supply sources (between the commercial power supply source and the storage battery system 80) for the load set 300-X of one customer, that is, the customer X.

As shown in FIG. 15, the customer X may receive power from the commercial power supply source and the storage battery system 80, and a customer Y may receive power only from the commercial power supply source.

A distributed power supply source other than a storage battery system may be owned by a customer.

(4) Billing system that calculates electricity charges in a case in which a storage battery system is provided for a household Billing processing in the power supply system (FIG. 15) of the above-described modified example (3) will be additionally discussed.

(4-1) Example in which power is supplied from a storage battery system provided for a household First, a power supply method for supplying power from a storage battery system which is owned by one customer and which is connected to a power supply path of a household of this customer (hereinafter such a storage battery system will be referred to as a "household storage battery system") will be additionally discussed.

Upon receiving information indicating that the power supply state is the power interruption state from the power interruption detector 20, the household control unit 30C may automatically switch the power supply source for the load set from the commercial power supply source to the storage battery system 80 (in other words, the household control unit 30C may start discharging from the storage battery system 80). However, when the storage battery system 80 owned by one customer automatically starts discharging, if no power is consumed by the load set of the customer X, for example, due to the absence of the customer X, power discharged from the storage battery system 80 is wasted.

Accordingly, in the above-described case, for example, if power is not consumed by a load set at the downstream side of a household storage battery system which is discharging power, or if the amount of power consumed by this load set is small for the amount of discharging from the household storage battery system, power discharged from the household storage battery system (or surplus power) may be supplied to another load set via a power line on the upstream side of the household storage battery system so as not to waste power discharged from the household storage battery system. For implementing this, in order to detect the charging amount and the discharging amount of a household battery, a wattmeter that is capable of measuring electric power in a forward direction and in a reverse direction is used, thereby making it possible to correctly detect how electric power is used. A wattmeter that is capable of measuring electric power in a forward direction and in a reverse direction is also used for a battery in a common area.

More specifically, for example, in the housing complex 1000 in the fifth embodiment, after the storage battery system 80 owned by the customer X has discharged, if power is not consumed by the load set 300-X of the customer X or if power consumed by the load set 300-X is small, the storage battery system 80 may supply power to a load set of another customer in the housing complex 1000 or to a load set in the common area.

(4-2) Billing processing performed in the power supply method in the above-described modified example (4-1)

As discussed in the above-described modified example (4-1), if power is supplied from a household storage battery system owned by one customer to another customer, it is preferable that the customer owning the household storage battery system benefits from selling electricity to another customer.

The customer owning the household storage battery system bears a charge for power supplied from the commercial power supply source to the household storage battery system. The amount of power supplied from the commercial power supply source to the household storage battery system includes, not only the amount of power charged to the household storage battery system, but also the amount of power consumed for driving the household storage battery system. Accordingly, the selling price of electricity (yen/kWh) supplied from the household storage battery system owned by the customer to another customer is preferably set to be higher than that from the commercial power supply source so as not to be unfair to the customer owning the household storage battery system.

Electric power supplied in the case of the power interruption state may have an added value. Accordingly, by considering this added value, the selling price of electricity (yen/kWh) supplied from a household storage battery system owned by one customer to another customer may be set.

An example of a billing system that calculates electricity charges by considering the above-described point will be described below with reference to FIG. 16.

A specific example will be described below, assuming that this billing system is applied to the customer X in FIG. 15, and that, upon receiving information indicating that the power supply state is the power interruption state from the power interruption detector 20, the household control unit 30C automatically switches the power supply source from the commercial power supply source to the storage battery system 80. If electric power discharged from the storage battery system is not consumed by the load set used by the customer X, for example, due to the absence of the customer X, or if the discharging amount per unit time consumed in the load set used by the customer X is smaller than a predetermined threshold, a surplus of electric power discharged from the storage battery system 80 is supplied to, for example, a load used by another customer. In FIG. 16(*a*), the lines of information shown in FIG. 15 are not shown.

Figure 16:
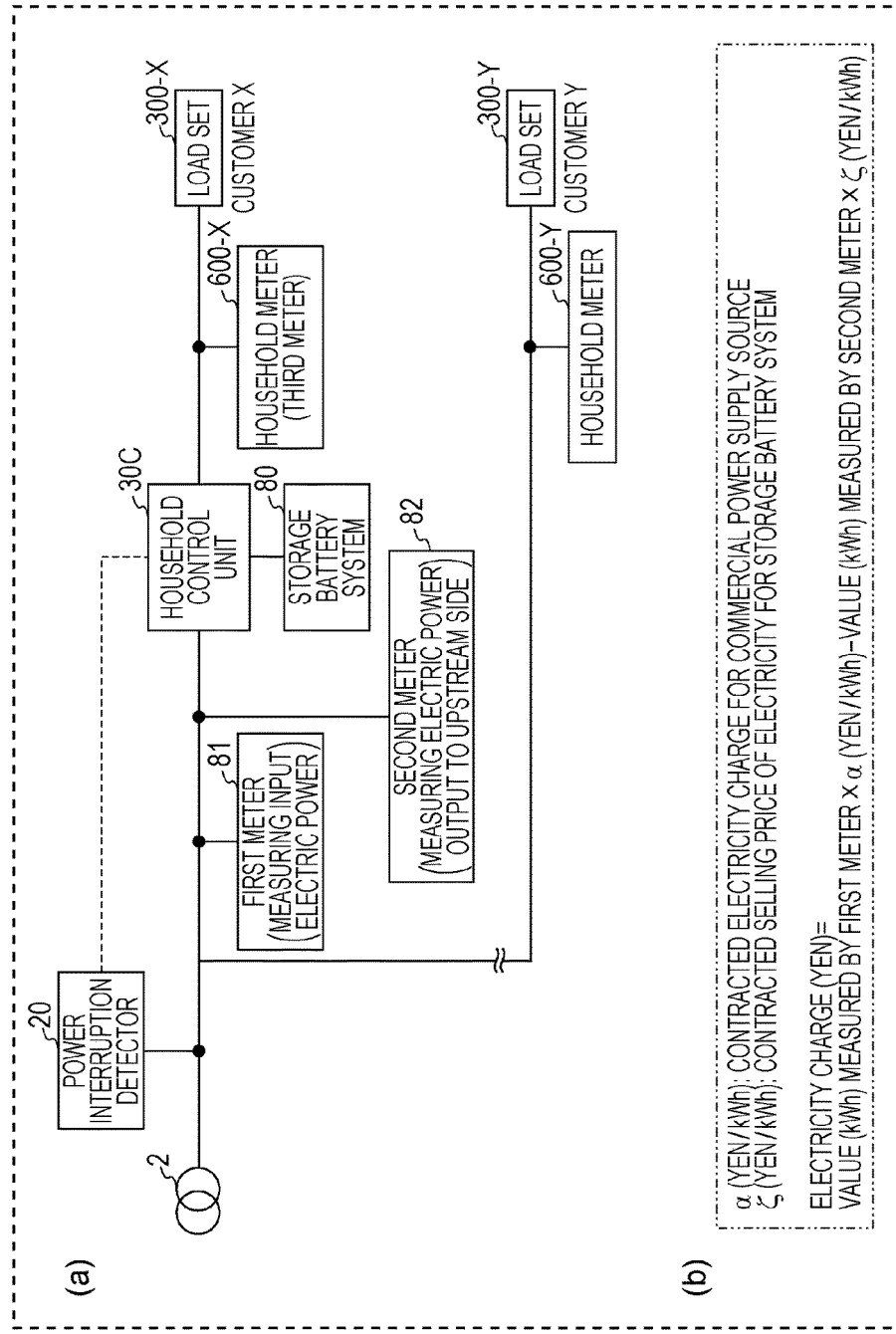
FIG. 16 is a diagram illustrating a billing system according to modified example 4, and an example of a billing calculation equation according to modified example 4.

As shown in FIG. 16(*a*), a first meter 81 and a second meter 82 are connected to an electrical grid on the upstream side of the customer X.

The first meter 81 measures electric power supplied from the commercial power supply source and consumed by the load set of the customer X owning the storage battery system 80.

The second meter 82 measures electric power supplied from the storage battery system 80 to customers other than the customer X, in other words, electric power output from the storage battery system 80 to the upstream side.

The first meter 81 and the second meter 82 may be formed as one measuring device. Alternatively, the first meter 81, the second meter 82, and a third meter (household meter 600-X) may be formed as one measuring device.

An example of a billing calculation equation applied to the customer X is shown in FIG. 16(*b*).

In the modified example (4), the contracted electricity charge for the commercial power supply source to the customer X is set to be α (yen/kWh), and the contracted selling price of electricity supplied from the storage battery system to customers other than the customer X is set to be ζ (yen/kWh).

In this case, as shown in FIG. 16(*b*), the electricity charge (yen) paid by the customer X is calculated as the electricity charge (yen)=(the value (kWh) measured by the first meter×α (yen/kWh))−(the value (kWh) measured by the second meter×ζ (yen/kWh)). As stated above, it is preferable that the selling price of electricity for the storage battery system is higher than the contracted electricity charge for the commercial power supply source (α>ζ).

In the modified example (4), if a user owns a storage battery system, electric power charged in this storage battery system can be used effectively, and also, the customer owning this storage battery system can benefit from selling electricity.

(5) Shortage state and detection of shortage state

In the above-described embodiments, power supplied from a commercial power supply source is running short is defined as the "shortage state", and the power control apparatus or the managing-and-setting device receives information indicating that the power supply state is the shortage state from the control center of the commercial power supply source via a network. However, the above-described embodiments are not restricted to this configuration.

(5-1) For example, a time period for which a considerable amount of electricity is likely to be consumed, such as in the daytime in summer or in the nighttime in winter, may be set to be a shortage time in advance.

Figure 17:
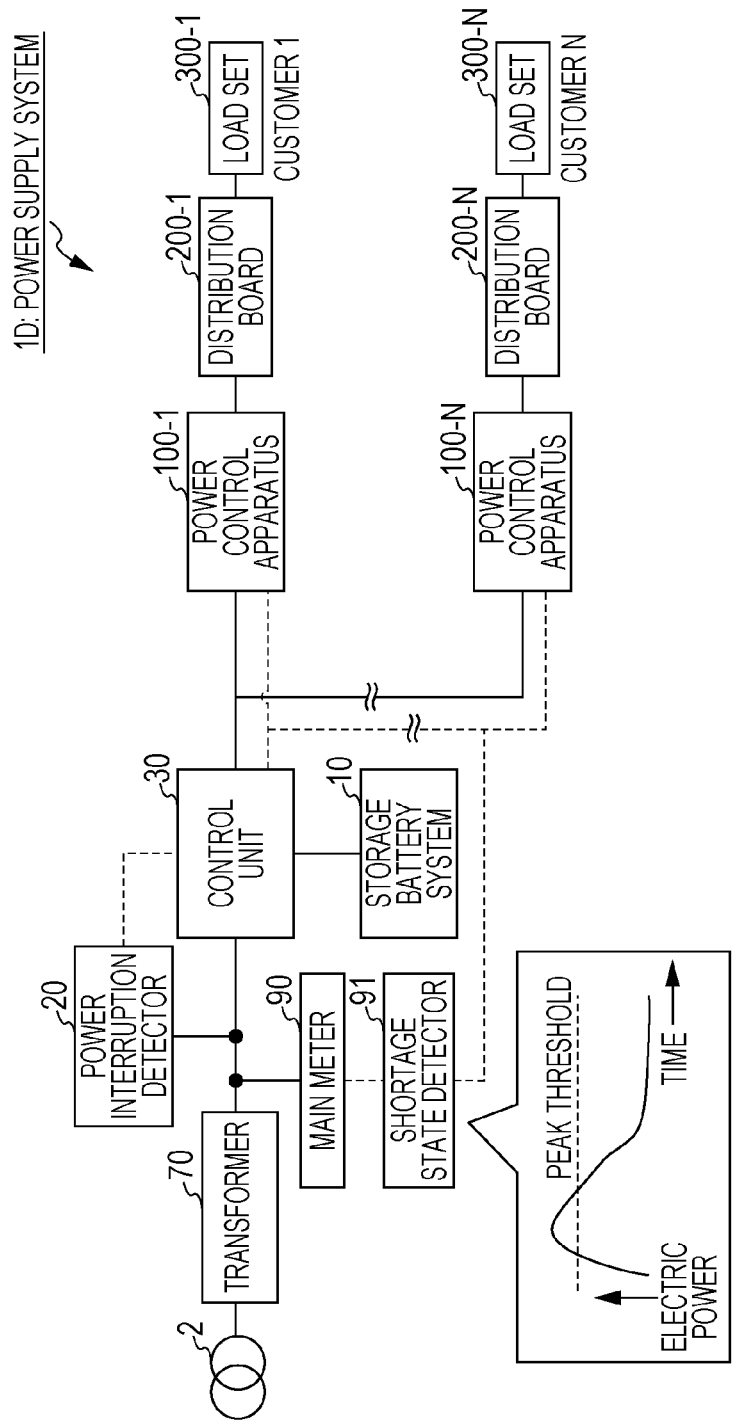
FIG. 17 is a diagram illustrating a power supply system according to modified example 5-2.

(5-2) For example, as shown in FIG. 17, the state in which electric power output from a transformer 70 is running short may be defined as the "shortage state", and the shortage state may be detected by the electrical grid on the downstream side of the transformer 70.

A power supply system 1D shown in FIG. 17 includes a main meter 90 and a shortage state detector 91 in addition to the elements of the power supply system 1 of the above-described first embodiment.

The main meter 90 measures electric power output from the transformer 70.

The shortage state detector 91 detects the shortage state of a commercial power supply source on the basis of the transition in the value measured by the main meter 90, that is, the transition in the amount of electric power output from the transformer 70. Upon detecting the shortage state, the shortage state detector 91 sends information indicating that the shortage state is detected to the power control apparatus 100.

More specifically, the shortage state detector 91 may detect the shortage state in the following manner. The shortage state detector 91 sets a peak threshold in advance, as shown in FIG. 17, and when the value measured by the main meter 90 exceeds the set peak threshold, the shortage state detector 91 determines that electric power is running short.

The peak threshold to be set in the shortage state detector 91 may be changed depending on the season or the time period. For example, in a time period for which a considerable amount of electricity is likely to be consumed, such as in the daytime in summer or in the nighttime in winter, the peak threshold may be set to be lower, thereby encouraging customers to save electricity.

Depending on the contract of the high-voltage electricity bulk reception, as the number of times the electricity consumption exceeds a preset peak threshold is greater, the electricity charge per electric power may become higher.

Thus, if, in a housing complex, such a high-voltage electricity bulk reception contract has been made with an electric power company, the peak threshold in the shortage state detector 91 may be set so that the electricity consumption in the entire housing complex will not exceed the peak threshold determined based on the high-voltage electricity bulk reception contract.

(5-3) Alternatively, the state in which electric power supplied from the transformer 70 to each customer is running short may be defined as the "shortage state", and the shortage state may be detected by the power control apparatus. This will be described more specifically. The power control apparatus of the above-described embodiments may include a power measuring unit and a shortage state detector. Then, the power measuring unit may measure power supplied from the transformer 70 to each customer, and the shortage state detector may detect the shortage state on the basis of the transition in the value measured by the electricity consumption measuring unit 610 (FIG. 8), as in the shortage state detector in the above-described modified example (5-2).

(6) Information concerning the power supply state, power supply sources, electricity consumption, and electricity charge may be continuously supplied to each customer.

In the above-described fourth embodiment, for each customer, information concerning, for example, the electricity consumption and electricity charge, is supplied to a terminal accessible by a customer. However, not only information concerning, for example, the electricity consumption and electricity charge, but also various items of useful information, such as real time information concerning power supply sources or the power supply state of each power supply source, may be supplied from a power supply system to each customer.

Figure 18:
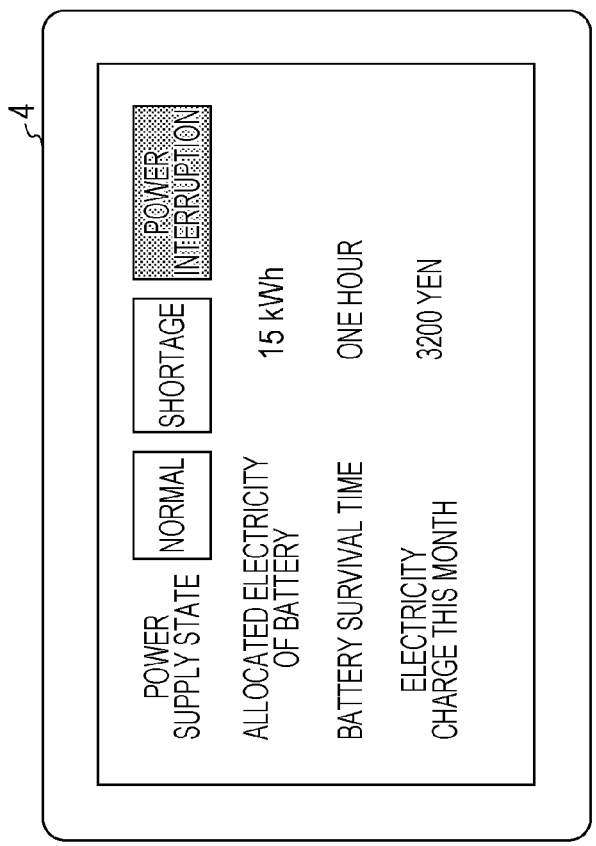
FIG. 18 illustrates an example of information concerning power supply and demand provided to a customer.

FIG. 18 illustrates a display example of various items of information concerning power supply to a customer on a terminal accessible by this customer.

As shown in FIG. 18, a tablet 4 may obtain and display information concerning from which power supply source the customer is receiving power in real time.

If the customer receives power from a storage battery system, the tablet 4 may obtain and display the remaining battery power and the remaining estimated time for which the customer can receive power from the storage battery system.

A meter which continuously measures the remaining battery power may be provided in the storage battery system, and the remaining battery power of the storage battery system may be measured by this meter.

If multiple customers share the storage battery system, electric power obtained by dividing the remaining battery power of the storage battery system by the number of customers sharing the storage battery system may be calculated as electric power that is usable per customer.

A meter which continuously measures the remaining battery power and discharging power may be provided in the storage battery system, and the remaining estimated time for which a customer can receive power from the storage battery system may be estimated and calculated on the basis of history information concerning the remaining battery power and discharging power.

If multiple customers share the storage battery system, electric power obtained by dividing the remaining battery power at the start of the use of the storage battery system by the number of customers sharing the storage battery system may be set to be electric power that is usable per customer so that power from the storage battery system can be equally distributed among the customers, and when a customer has consumed the electric power that is usable per customer, power from the storage battery system to this customer may be terminated.

If multiple customers share the storage battery system, the remaining estimated time for which a customer can receive power from the storage battery system may be estimated and calculated on the basis of electric power that is usable per customer and history information concerning power supplied from the storage battery system and consumed by this customer.

In the above-described fourth embodiment, the billing processing device 60 may supply information concerning, for example, the electricity consumption and electricity charge, to a terminal accessible by a customer. However, the power control apparatus or the household meter used in the above-described embodiments may directly supply such information to a terminal. Alternatively, the power interruption detector, the shortage state detector, or the control unit may supply information to the terminal.

(7) The power control apparatus may include a power supply circuit and may secure, by itself, power necessary for driving the power control apparatus by using the power supply circuit.

In the above-described embodiments, the setting unit, the controller, and the communication unit of the power control apparatus receive power from an independent power supply source so that power can be supplied even in the power interruption state, or receive power from a UPS in the case of the power interruption state. However, means for supplying power to each of the setting unit, the controller, and the communication unit is not restricted to the above-described means.

For example, the power control apparatus may also include a power supply circuit. The power supply circuit may convert an alternating current flowing through the power supply path into a direct current suitable for each of the setting unit, the controller, and the communication unit, and may supply the converted direct current to each of the setting unit, the controller, and the communication unit so as to drive it.

Figure 19:
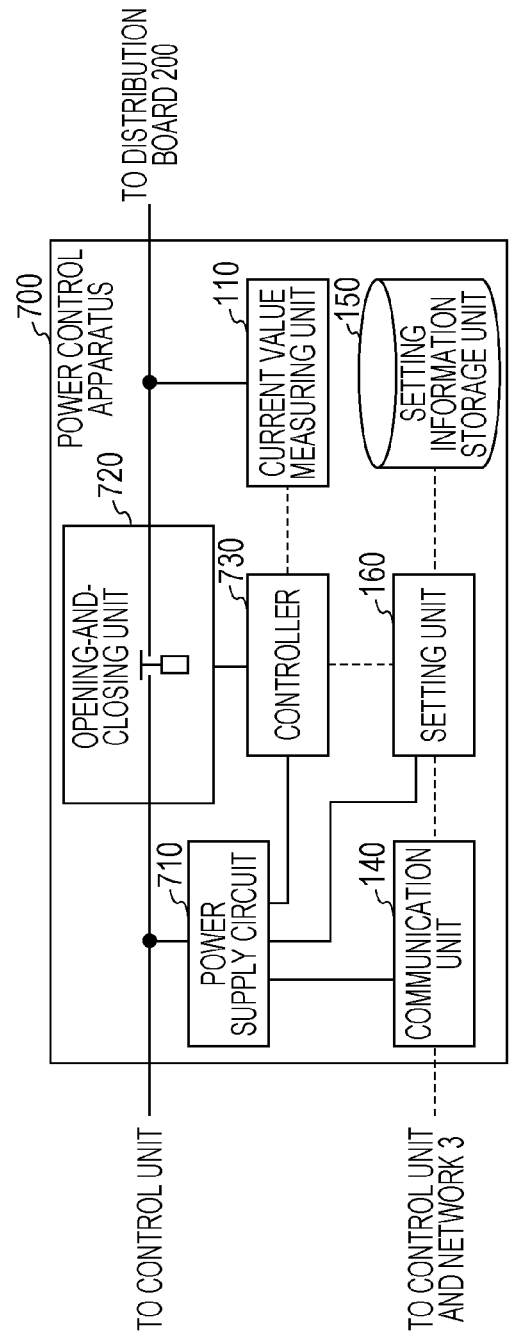
FIG. 19 is a diagram illustrating the configuration of a power control apparatus according to modified example 7.

Such a power control apparatus will be described below with reference to FIG. 19.

A power control apparatus 700 includes a current value measuring unit 110, a communication unit 140, a setting information storage unit 150, a setting unit 160, a power supply circuit 710, and an excitation opening-and-closing unit 720, and a controller 730.

The current value measuring unit 110, the communication unit 140, the setting information storage unit 150, the setting unit 160 are similar to those of the power control apparatus of the above-described first embodiment. However, the communication unit 140 and the setting unit 160 are operated by receiving power from the power supply circuit 710, which will be discussed below.

The power supply circuit 710 converts part of an alternating current input into the power control apparatus 700 into a direct current and supplies the converted direct current to the communication unit 140, the setting unit 160, and the controller 730.

The excitation opening-and-closing unit 720 is disposed on the power supply path to a load set, and opens and closes the power supply path under the control of the controller 730, which will be discussed below. More specifically, the excitation opening-and-closing unit 720 is turned ON when a direct current is input by the controller 730 and is turned OFF when input of a direct current by the controller 730 is stopped.

While a direct current is being supplied from the power supply circuit 710, the controller 730 constantly inputs a supplied direct current to the excitation opening-and-closing unit 720, thereby performing ON control of the excitation opening-and-closing unit 720. Accordingly, while power is being supplied to a load set from any of the power supply sources, that is, while an alternating current is flowing through the power supply path, the excitation opening-and-closing unit 720 is ON. On the other hand, immediately after the power interruption state, the controller 730 does not input a direct current to the excitation opening-and-closing unit 720 (maintains the OFF control state) until an instruction to perform ON control of the excitation opening-and-closing unit 720 is received via the communication unit, thereby making it possible to perform ON control of the excitation opening-and-closing unit 720 after the controller 730 has set a suitable maximum current value. It is thus possible to set a suitable maximum current value before starting to supply power to a household in the case of the power interruption state. In the case of the power recovery state, a suitable maximum current value used in each household under the normal condition can be set by a similar procedure.

As in the controller 130 of the above-described first embodiment, the controller 730 also performs OFF control of the excitation opening-and-closing unit 720 on the basis of a set maximum current control value and a set restart control time.

However, if the controller 730 determines that the current value measured by the current value measuring unit 110 is equal to or greater than the set maximum current control value, it stops inputting a direct current to the excitation opening-and-closing unit 720 so as to perform OFF control of the excitation opening-and-closing unit 720 and to stop supplying power to a load set. If the controller 730 determines that the set restart control time has elapsed after starting to perform OFF control of the excitation opening-and-closing unit 720, it restarts inputting a direct current to the excitation opening-and-closing unit 720 so as to perform ON control of the excitation opening-and-closing unit 720 and to restart supplying power to the load set.

In the state in which power is not supplied from any of the power supply sources to the load set, that is, in the state in which an alternating current is not flowing through the power supply path, the controller 730 is unable to input a direct current to the excitation opening-and-closing unit 720. Accordingly, the excitation opening-and-closing unit 720 is inevitably OFF.

In the power control apparatus 700, an alternating current flowing through the power supply path is converted into a direct current in the power supply circuit 710, and the converted direct current is supplied to the elements of the power control apparatus 700. Thus, it is possible to secure power necessary for driving the power control apparatus 700 by itself.

Instead of in the power control apparatus of the above-described embodiments, a power supply circuit may be included in a device, such as a distribution board or a general smart meter, thereby securing power necessary for driving the distribution board or the general smart meter by itself.

(8) A power interruption detection function may be integrated in the power control apparatus.

In the above-described embodiments, the power supply system (or the power control system or the billing system) includes a power interruption detector, and the power interruption detector detects the power interruption state of the commercial power supply state, that is, the power interruption state of the entire system. However, the above-described embodiments are not restricted to this configuration.

Figure 20:
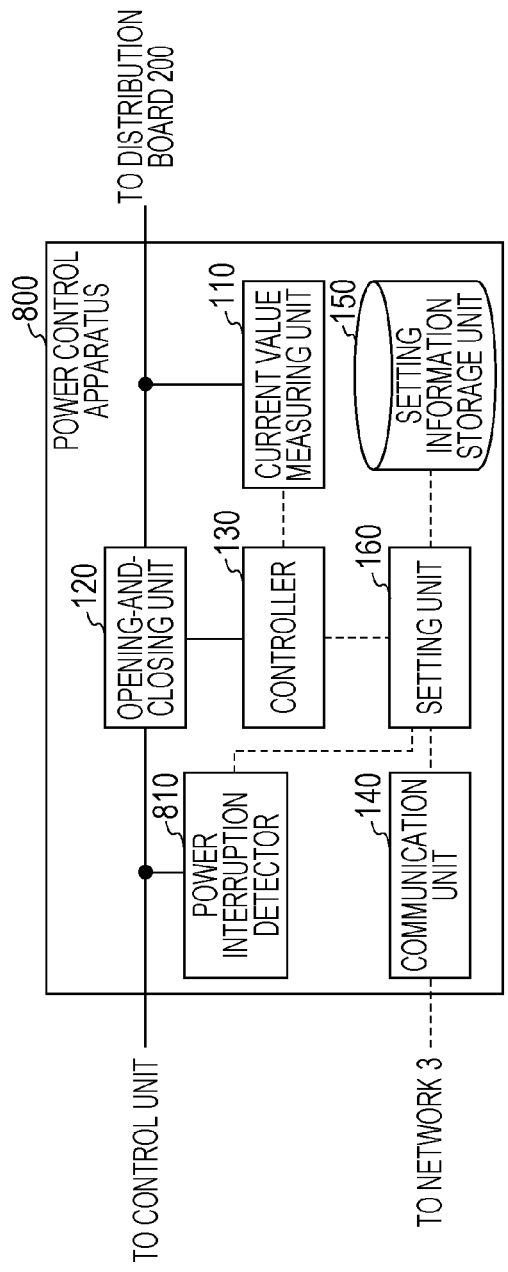
FIG. 20 is a diagram illustrating the configuration of a power control apparatus according to modified example 8.

For example, as in a power control apparatus 800 shown in FIG. 20, the power control apparatus of each of the above-described embodiments may include a power interruption detector 810 that detects a power interruption state in which power supply to a load set disposed on the downstream side of the power control apparatus is interrupted and a power recovery state in which power supply to this load set is restarted after the occurrence of power interruption. As in the above-described power interruption detector, the power interruption detector 810 may utilize a general power interruption and power recovery detecting method.

The current value measuring unit 110, the opening-and-closing unit 120, the controller 130, the communication unit 140, the setting information storage unit 150, the setting unit 160 are similar to those of the power control apparatus 100 of the above-described embodiments. However, in the power control apparatus 800, the communication unit 140 communicates with the network 3, and the setting unit 160 sets the maximum current control value and the restart control time used by the controller 130 in accordance with the power interruption state or the power recovery state detected by the power interruption detector 810.

(9) A power interruption detection function may be integrated in the control unit.

In the above-described embodiments, the power interruption detector and the control unit (or the household control unit) are provided separately. However, the power interruption detection function may be integrated in a control unit.

(10) Power to be supplied to multiple customers may be controlled together.

In the above-described embodiments and modified examples, the power control apparatus is disposed on the power supply path shunted for each customer and controls power to be supplied to a load set of each customer. However, the power control apparatus of the above-described embodiments is not restricted to this configuration.

For example, the power control apparatus may be disposed on the power supply path shunted to each group of multiple customers, and may control power to be supplied to loads of each group of multiple customers together.

(11) Functions of the power control apparatus may be integrated in a distribution board.

In the above-described embodiments and modified examples, the power control apparatus and the distribution board are provided separately. However, the functions of the power control apparatus may be integrated in a distributed board.

(12) Electricity charge may be calculated on a terminal of a customer.

The billing system 1B of the above-described fourth embodiment includes the billing processing device 60, and the billing processing device 60 calculates the electricity charge to each customer. However, the billing system 1B of the above-described fourth embodiment is not restricted to this configuration. For example, a terminal accessible by a customer may directly obtain the measurement value of the electricity consumption from the household meter 600 and may calculate the electricity charge. Alternatively, the calculation of the electricity charge may be conducted by using an application downloaded to the terminal. Billing calculations discussed in the above-described modified example (4) may also be conducted by a terminal and be displayed on the terminal.

(13) Functions of the power control apparatus may be integrated in a smart meter.

For example, the functions of the power control apparatus of the above-described embodiments and modified examples may be integrated in the household meter 600 of the above-described fourth embodiment.

Figure 21:
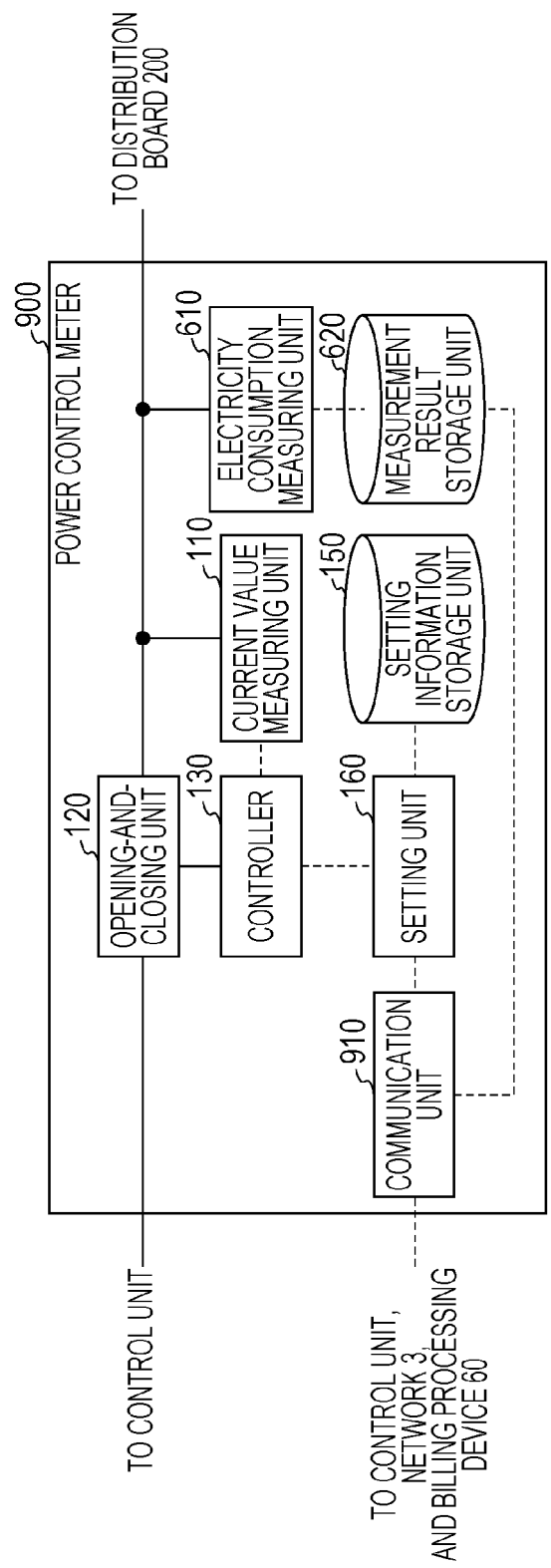
FIG. 21 is a diagram illustrating the configuration of a power control meter according to modified example 13.

FIG. 21 illustrates an example of a power control meter in which the functions of the power control apparatus 100 of the above-described first embodiment are integrated in the household meter 600 of the above-described fourth embodiment. The configurations of the elements of a power control meter 900 are similar to those of the above-described first through fourth embodiments, and an explanation thereof will thus be omitted. However, a communication unit 910 includes the functions of the communication unit 140 of the power control apparatus 100 and the functions of the communication unit 630 of the household meter 600.

(14) Installation of power control apparatus

The power control apparatus of the above-described embodiments may be installed in any place. For example, in a housing complex, the power control apparatus may be set in a housing area of each household or may be installed as equipment in a common area.

(15) Integrated circuit, program, and recording medium

In the above-described embodiments, the configurations of the setting unit and the controller (first controller) of the power control apparatus, the second controller of the distribution board, the setting instruction unit of the managing-and-setting device, and the charge calculator of the billing processing device may be constituted by a CPU (Central Processing Unit) that executes a control program stored in a ROM (Read Only Memory).

The above-described configurations may also be implemented as a program executed by a computer that operates under a CPU or an MPU. This program may be stored in a storage medium, such as a ROM (Read Only Memory) or a RAM (Random Access Memory), or may be distributed via a transmission medium, such as the Internet.

The above-described configurations are not restricted to a software configuration operating under a CPU or an MPU, and may be implemented as hardware, such as a LSI (Large Scale Integration), which is typically an integrated circuit. These configurations may be individually formed into single chips, or some or all of the configurations may be formed into one chip. The integrated circuit may be called an IC, a system LSI, a super LSI, or an ultra LSI, depending on the integration degree. The integration technology of the configurations is not restricted to an LSI technology. Instead, a dedicated circuit or a general-purpose processor may be used. Moreover, a FPGA (Field Programmable Gate Array) or a reconfigurable processor that may reconfigure connections or settings of circuit cells within an LSI may be used. Further, due to the progress of semiconductor technologies or the appearance of a derivative technology, if a circuit integration technology which replaces a current semiconductor technology is developed, the functional blocks may be integrated by utilizing such a technology.

[7. Appendices]

The configurations of power control apparatuses according to embodiments of the present disclosure, modified examples thereof, and advantages thereof will be described below.

A description will be given below of the configurations of a power control apparatus, power control system, power control method, program, billing processing system, billing processing method, and measuring device, modified examples thereof, and advantages thereof.

(A) A power control apparatus according to an embodiment of the present disclosure is a power control apparatus including: a measure that measures a value of a current supplied from a power supply source to a load set; a switch disposed on a power supply path from the power supply source to the load set; control circuitry that performs OFF control of the switch when the control circuitry determines that a measurement value of the current exceeds a maximum current control value; and a setter that sets a maximum current control value to be used by the control circuitry. Upon obtaining information indicating that a state is a first state in which power is supplied from the power supply source to the load set under normal conditions, the setter sets a first maximum current value as the maximum current control value. Upon obtaining information indicating that the state is a second state in which maximum power supplied from the power supply source to the load set is reduced to a smaller level than in the first state, the setter sets a second maximum current value, which is smaller than the first maximum current value, as the maximum current control value.

With this configuration, the power control apparatus (A) is able to control maximum power supplied from the power supply source to the load set in accordance with whether the state is the first state or the second state.

(B) The power control apparatus of the above-described embodiment (A) may further include a determiner that determines whether the state is the first state or the second state. The setter may set the maximum current control value on the basis of a determination result of the determiner.

With this configuration, the power control apparatus (B) is able to determine whether the state is the first state or the second state. When the power control apparatus (B) determines that the state is the first state, it is able to set the first maximum current value as the maximum current control value.

The determiner may make the above-described determination by obtaining information indicating that the state is the first information or information indicating that the state is the second information from an external device. Alternatively, the determiner may have a function of detecting that the state is the first state and that the state is the second state so as to detect that the state is the first state or that the state is the second state by itself, thereby determining whether the state is the first state or the second state.

(C) In the power control apparatus of the above-described embodiment (A): the control circuitry may perform ON control of the switch when the control circuitry determines that a restart control time has elapsed after performing OFF control of the switch; the setter may set a first restart time as the restart control time upon obtaining information indicating that the state is the first state; and the setter may set a second restart time, which is longer than the first restart time, as the restart control time upon obtaining information indicating that the state is the second state.

With this configuration, after disconnecting the electrical circuit by performing OFF control of the switch, the power control apparatus (C) starts ON control of the switch after the lapse of the restart time corresponding to the first state or the second state, thereby making it possible to reduce the amount of power supplied from the power supply source to the load set.

(D) The power control apparatus of the above-described embodiment (C) may further include a determiner that determines whether the state is the first state or the second state. The setter may set the current control value and the restart control time on the basis of a determination result of the determiner.

With this configuration, the power control apparatus (D) determines whether the state is the first state or the second state, and when it determines that the state is the first state, the power control apparatus (D) is able to set the first maximum current value as the maximum current control value, and when it determines that the state is the second state, the power control apparatus (D) is able to set the second maximum current value as the maximum current control value. The determiner may make the above-described determination by obtaining information indicating that the state is the first information or information indicating that the state is the second information from an external device. Alternatively, the determiner may have a function of detecting that the state is the first state and that the state is the second state so as to detect that the state is the first state or that the state is the second state by itself, thereby determining whether the state is the first state or the second state.

(E) In the power control apparatus of the above-described embodiment (A), the second state may be a shortage state in which power supplied from the power supply source to the load set is running short.

With this configuration, the power control apparatus (E) is able to reduce maximum power supplied from the power supply source to the load set in the case of the shortage state in which power supplied from the power supply source is running short.

(F) In the power control apparatus of the above-described embodiment (A): the power supply source may include a main power supply source and a sub power supply source; the first state may be a state in which power is supplied from the main power supply source to the load set; and the second state may be a power interruption state in which power supply from the main power supply source to the load set is stopped and may be a state in which power is supplied from the sub power supply source to the load set.

With this configuration, in the power interruption state in which power supply from the main power supply source is stopped and power is supplied from the sub power supply source to the load set, the power control apparatus (F) is able to reduce maximum power supplied from the sub power supply source to the load set to a smaller level than maximum power supplied from the main power supply source to the load set.

(G) In the power control apparatus of the above-described embodiment (A), upon obtaining information indicating that the state is a third state in which maximum power supplied from the power supply source to the load set is reduced to a lower level, the third state being different from the second state, the setter may set a third maximum current value, which is smaller than the first maximum current value, as the maximum current control value.

With this configuration, the power control apparatus (G) is able to control maximum power supplied from the power supply source to the load set in accordance with whether the state is the first state, the second state, or the third state.

(H) In the power control apparatus of the above-described embodiment (C), upon obtaining information indicating that the state is a third state in which maximum power supplied from the power supply source to the load set is reduced to a smaller level, the third state being different from the second state, the setter may set a third maximum current value, which is smaller than the first maximum current value, as the maximum current control value and sets a third restart time, which is longer than the first restart time, as the restart control time.

With this configuration, after disconnecting the electrical circuit by performing OFF control of the switch, the power control apparatus (H) starts ON control of the switch after the lapse of the restart time corresponding to the first state, the second state, or the third state, thereby making it possible to reduce the amount of power supplied from the power supply source to the load set.

(I) In the power control apparatus of the above-described embodiment (C): the load set may be constituted by loads used by a customer; and the maximum current control value and the restart control time may be determined on the basis of at least one of a contract made by the customer concerning supply and demand of power supplied from the power supply source, history information concerning power consumption of the customer, and information concerning an electric-power consumer belonging to the customer.

With this configuration, the power control apparatus (I) is able to control power by reflecting at least one of a power supply and demand contract made by a customer, history information concerning power consumption of the customer, and the status of electric-power consumers belonging to the customer.

(J) The power control apparatus of the above-described embodiment (A) may further include a power supply circuit that is connected to the power supply path on a farther upstream side than the switch and that converts part of an alternating current supplied from the power supply source to the load set into a direct current. The power control apparatus may be driven by a direct current converted from an alternating current by the power supply circuit.

With this configuration, the power control apparatus (J) is able to obtain power necessary for driving the power control apparatus without receiving power from an external power supply source.

(K) The power control apparatus of the above-described embodiment (A) may further include a power supply circuit that is connected to the power supply path on a farther upstream side than the switch and that converts part of an alternating current supplied from the power supply source to the load set into a direct current and supplies the converted direct current to the control circuitry. The switch may include a contact disposed on the power supply path and an excitation coil that opens and closes the contact due to an excitation effect. The control circuitry may maintain ON control of the switch by supplying a direct current received from the power supply circuit to the excitation coil and may maintain OFF control of the switch by not supplying a direct current received from the power supply circuit to the excitation coil.

With this configuration, the power control apparatus (K) is able to control opening and closing of the power supply path due to the excitation effect. The power control apparatus (K) is also able to obtain power supplied to the switch by using the power supply unit.

(L) In the power control apparatus of the above-described embodiment (K): the power supply source may include a main power supply source and a sub power supply source; upon an occurrence of power interruption of the main power supply source, the power supply source may be switched from the main power supply source to the sub power supply source so as to start power supply from the sub power supply source to the load set; upon an occurrence of power recovery of the main power supply source after the main power supply source has been switched to the sub power supply source, the power supply source may be switched from the sub power supply source to the main power supply source so as to restart power supply from the main power supply source to the load set; the first state may be a state in which power is supplied from the main power supply source to the load set; the second state may be a state in which power is supplied from the sub power supply source to the load set; and when the contact enters an opened state by not supplying a direct current from the power supply circuit to the control circuitry when switching the power supply source, the control circuitry may maintain OFF control until the control circuitry determines that the maximum current control value is updated by the setter.

With this configuration, the power control apparatus (L) is able to start ON control of the switch after the maximum current control value is updated by the setter.

(M) A power control method according to an embodiment of the present disclosure is a power control method for a power control apparatus which controls a switch disposed on a power supply path from a power supply source to a load set. The power control method includes: measuring a value of a current supplied from the power supply source to the load set; performing OFF control of the switch when it is determined that a measurement value of the current exceeds a maximum current control value; and setting a maximum current control value to be used in the control step. Upon obtaining information indicating that a state is a first state in which power is supplied from the power supply source to the load set under normal conditions, a first maximum current value is set as the maximum current control value. Upon obtaining information indicating that the state is a second state in which maximum power supplied from the power supply source to the load set is reduced to a lower level than in the first state, a second maximum current value, which is smaller than the first maximum current value, is set as the maximum current control value.

With this configuration, in the power control method (M), it is possible to control maximum power supplied from the power supply source to the load set in accordance with whether the state is the first state or the second state.

(N) A program according to an embodiment of the present disclosure is a program causing a computer to execute power control processing of a power control apparatus which controls a switch disposed on a power supply path from a power supply source to a load set. The power control processing includes: obtaining a measurement value of a current supplied from the power supply source to the load set; performing OFF control of the switch when it is determined that a measurement value of the current exceeds a maximum current control value; and setting a maximum current control value to be used in the control step. Upon obtaining information indicating that a state is a first state in which power is supplied from the power supply source to the load set under normal conditions, a first maximum current value is set as the maximum current control value. Upon obtaining information indicating that the state is a second state in which maximum power supplied from the power supply source to the load set is reduced to a lower level than in the first state, a second maximum current value, which is smaller than the first maximum current value, is set as the maximum current control value.

With this configuration, by using the program (N), it is possible to control maximum power supplied from the power supply source to the load set in accordance with whether the state is the first state or the second state.

(O) A power control system according to an embodiment of the present disclosure is a power control system which controls power supplied from a power supply source to a load set. The power control system includes: a measure that measures a value of a current supplied from the power supply source to a load set; a switch disposed on a power supply path from the power supply source to the load set; control circuitry that performs OFF control of the switch when it is determined that a measurement value of the current exceeds a maximum current control value; a setter that sets a maximum current control value to be used by the control circuitry; and a determiner that determines whether a state is a first state in which power is supplied from the power supply source to the load set under normal conditions or a second state in which maximum power supplied from the power supply source to the load set is reduced to a smaller level than in the first state. When the determiner determines that the state is the first state, the setter sets a first maximum current value as the maximum current control value. When the determiner determines that the state is the second state, the setter sets a second maximum current value, which is smaller than the first maximum current value, as the maximum current control value.

With this configuration, the power control system (O) is able to control maximum power supplied from the power supply source to the load set in accordance with whether the state is the first state or the second state.

(P) A power control method according to an embodiment of the present disclosure is a power control method for a power control system which controls a switch disposed on a power supply path from a power supply source to a load set. The power control method includes: measuring a value of a current supplied from the power supply source to the load set; performing OFF control of the switch when it is determined that a measurement value of the current exceeds a maximum current control value; setting a maximum current control value to be used in the control step; and determining whether a state is a first state in which power is supplied from the power supply source to the load set under normal conditions or a second state in which maximum power supplied from the power supply source to the load set is reduced to a smaller level than in the first state. When the state is determined to be the first state, a first maximum current value is set as the maximum current control value. When the state is determined to be the second state, the setter sets a second maximum current value, which is smaller than the first maximum current value, as the maximum current control value.

With this configuration, in the power control method (P), it is possible to control maximum power supplied from the power supply source to the load set in accordance with whether the state is the first state or the second state.

(Q) A billing system according to an embodiment of the present disclosure is a billing system which is applicable to a case in which a subject customer owns a storage battery system and the storage battery system supplies electric power to the subject customer and a customer other than the subject customer. The billing system includes: a first measure that measures an amount of electric power supplied from a main power supply source to a load set of the subject customer owning the storage battery system; a second measure that measures an amount of electric power supplied from the storage battery system to a customer other than the subject customer; a first calculator that calculates an electricity charge for electric power supplied from the main power supply source to the subject customer, on the basis of a first billing calculation equation applied to electric power supplied from the main power supply source and a value measured by the first calculating unit; a second calculator that calculates a selling price for electric power which is supplied from the storage battery system to a customer other than the subject customer and which is returned to the subject customer, on the basis of a second billing calculation equation applied to electric power supplied from the storage battery system to a customer other than the subject customer and a value measured by the second measure; and an electricity-charge calculator that calculates an electricity charge to be paid by the subject customer by subtracting the selling price calculated by the second calculator from the electricity charge calculated by the first calculator.

With this configuration, in the billing system (Q), the selling price for electric power supplied from the storage battery system to a customer other than the subject customer can be subtracted from the electricity charge to this subject customer.

(R) A billing method according to an embodiment of the present disclosure is a billing method for a billing system which is applicable to a case in which a subject customer owns a storage battery system and the storage battery system supplies electric power to the subject customer and a customer other than the subject customer. The billing method includes: measuring an amount of electric power supplied from a main power supply source to a load set of the subject customer owning the storage battery system; measuring an amount of electric power supplied from the storage battery system to a customer other than the subject customer; calculating an electricity charge for electric power supplied from the main power supply source to the subject customer, on the basis of a first billing calculation equation applied to electric power supplied from the main power supply source and a value measured by the first calculating unit; calculating a selling price for electric power which is supplied from the storage battery system to a customer other than the subject customer and which is returned to the subject customer, on the basis of a second billing calculation equation applied to electric power supplied from the storage battery system to a customer other than the subject customer and a value measured by the second measure; and calculating an electricity charge to be paid by the subject customer by subtracting the selling price calculated by the second calculator from the electricity charge calculated by the first calculator.

With this configuration, in the billing method (R), the selling price for electric power supplied from the storage battery system to a customer other than the subject customer can be subtracted from the electricity charge to this subject customer.

The power control apparatus of the present disclosure finds various applications in which power is supplied from a power supply source to a load set. The power control apparatus of the present disclosure is applicable to a measuring device, such as a smart meter, or a distribution board. The billing system of the present disclosure finds various applications in which power is supplied from multiple power supply sources to a load set.

What is claimed is:

1. A power control apparatus comprising:
   a measurement unit that measures a value of a current supplied from a power supply source to a load set;
   a switch disposed on a power supply path from power supply source to the load set;
   a setter that sets a first maximum current value as a maximum current control value in the case of a normal state in which the load set receives power from a main power supply source and that sets a second maximum current value, which is smaller than the first maximum current value, as the maximum current control value when the load set receives power from the sub power supply source due to an occurrence of power interruption of the main power supply source; and
   control circuitry that turns OFF the switch when the value of the current measured by the measurement unit exceeds the first maximum current value in the case of the normal state and that turns OFF the switch when the load set receives power from the sub power supply source due to an occurrence of power interruption of the main power supply source and the value of the current measured by the measurement unit exceeds the second maximum current value.

2. The power control apparatus according to claim 1, wherein the main power supply source is a commercial power supply source and the sub power supply source is a storage battery system.

3. The power control apparatus according to claim 1, wherein:
   the control circuitry turns ON the switch when a restart control time has elapsed after the control circuitry has turned OFF the switch; and
   the setter sets a first restart time in the case of the normal state as the restart control time and sets a second restart time, which is longer than the first restart time, as the restart control time when the load set receives power from the sub power supply source due to an occurrence of power interruption of the main power supply source.

4. The power control apparatus according to claim 1, wherein:
during a power-saving time period for which power supplied from the main power supply source to the load set is reduced, the setter sets a third maximum current value, which is smaller than the first maximum current value, as the maximum current control value; and
the control circuitry turns OFF the switch when a value of a current supplied from the main power supply source in the power-saving time period exceeds the third maximum current value.

5. The power control apparatus according to claim 3, wherein:
during a power-saving time period for which power supplied from the main power supply source to the load set is reduced, the setter sets a third maximum current value, which is smaller than the first maximum current value, as the maximum current control value and sets a third restart time, which is longer than the first restart time, as the restart control time; and
the control circuitry turns OFF the switch when a value of a current supplied from the main power supply source in the power-saving time period exceeds the third maximum current value.

6. The power control apparatus according to claim 4, further comprising:
a communication unit that receives, via a communication network, a power-saving request signal indicating a request to save power during the power-saving time period,
wherein the setter sets the third maximum current value upon receiving the power-saving request signal.

7. The power control apparatus according to claim 3, wherein:
the load set is constituted by loads used by a customer; and
the maximum current control value and the restart control time are determined on the basis of at least one of a contract made by the customer concerning supply and demand of power supplied from the power supply source, history information concerning power consumption of the customer, and information concerning an electric-power consumer belonging to the customer.

8. The power control apparatus according to claim 1, further comprising:
a power supply circuit that is connected to the power supply path on a farther upstream side than the switch and that converts part of an alternating current supplied from the power supply source to the load set into a direct current,
wherein the control circuitry drives the power control apparatus by using the direct current obtained by the power supply circuit.

9. The power control apparatus according to claim 8, wherein:
the switch includes a contact disposed on the power supply path and an excitation coil that opens and closes the contact due to an excitation effect; and
the control circuitry turns ON the switch by supplying a direct current received from the power supply circuit to the excitation coil and turns OFF the switch by not supplying a direct current received from the power supply circuit to the excitation coil.

10. The power control apparatus according to claim 9, wherein:
upon an occurrence of power recovery of the main power supply source after a power supply source which supplies power to the load set has been switched from the main power supply source to the sub power supply source due to an occurrence of power interruption of the main power supply source, the power supply source is switched from the sub power supply source to the main power supply source so as to restart power supply from the main power supply source to the load set; and
when the contact enters an opened state by not supplying a direct current from the power supply circuit to the control circuitry when switching the power supply source, the control circuitry maintains an OFF state of the switch until the maximum current control value is updated by the setter.

11. A control method comprising:
measuring a value of a current supplied from a power supply source to a load set;
setting a first maximum current value as a maximum current control value in the case of a normal state in which the load set receives power from a main power supply source;
turning OFF the switch when the measured value of a current supplied from the main power supply source exceeds the first maximum current value in the case of the normal state;
setting a second maximum current value, which is smaller than the first maximum current value, as the maximum current control value when the load set receives power from the sub power supply source due to an occurrence of power interruption of the main power supply source;
measuring a value of a current supplied from the sub power supply source to the load set when the load set receives power from the sub power supply source due to an occurrence of power interruption of the main power supply source; and
turning OFF the switch when the measured value of a current supplied from the sub power supply source exceeds the second maximum current value in the case of power interruption of the main power supply source.

* * * * *